United States Patent [19]
Motegi

[11] Patent Number: 5,221,863
[45] Date of Patent: Jun. 22, 1993

[54] PHASE-LOCKED LOOP CLOCK SIGNAL GENERATOR

[75] Inventor: Hiroyuki Motegi, Kawasaki, Japan

[73] Assignee: Kabushiki Kaisha Toshiba, Kawasaki, Japan

[21] Appl. No.: 749,184

[22] Filed: Aug. 23, 1991

[30] Foreign Application Priority Data

Aug. 24, 1990 [JP] Japan .................. 2-223620

[51] Int. Cl.$^5$ .............. H03K 5/13; H03K 5/159; H03K 3/01
[52] U.S. Cl. ................ 307/269; 307/262; 307/603; 307/606; 328/55; 328/155
[58] Field of Search ........... 307/262, 601–605, 307/269; 328/55, 155; 331/1 A, 17, 25

[56] References Cited

U.S. PATENT DOCUMENTS

| | | | |
|---|---|---|---|
| 4,899,071 | 2/1990 | Morales | 307/602 |
| 4,912,433 | 3/1990 | Motegi et al. | 331/8 |
| 4,922,141 | 5/1990 | Lofgren et al. | 307/602 |
| 5,054,038 | 10/1991 | Hedberg | 328/155 |
| 5,059,838 | 10/1991 | Motegi et al. | 307/603 |
| 5,562,411 | 12/1985 | O'Rourke et al. | 331/1 A |

FOREIGN PATENT DOCUMENTS

0318930 6/1989 European Pat. Off. .
0379169 7/1990 European Pat. Off. .
0380979 8/1990 European Pat. Off. .
2604836 4/1988 France .

OTHER PUBLICATIONS

IEEE Journal of Solid-State Circuits, vol. SC-22, No. 2, Apr. 1987; "Design of PLL-Based Clock Generator Circuits", pp. 255–261.

*Primary Examiner*—Timothy P. Callahan
*Attorney, Agent, or Firm*—Oblon, Spivak, McClelland, Maier & Neustadt

[57] ABSTRACT

A variable delay circuit delays an input signal by an amount corresponding to a control signal. A signal delay amount of the variable delay circuit is detected by a delay amount detector circuit, and the detection signal is supplied to a charge pump circuit. In the charge pump circuit 12, a DC voltage according to a pulse width ratio of the input signal to an detection output from the delay amount detector circuit is generated and fed back to the variable delay circuit as the control signal. A predetermined DC voltage output from an initial voltage setting circuit is applied to a path of the control signal output from the charge pump circuit 12. An output voltage from the initial voltage setting circuit is set to be an approximate value of a value such that a desired delay amount is obtained in each of delay stages of the variable delay circuit, and the initial voltage setting circuit sets an initial value of the control signal.

28 Claims, 17 Drawing Sheets

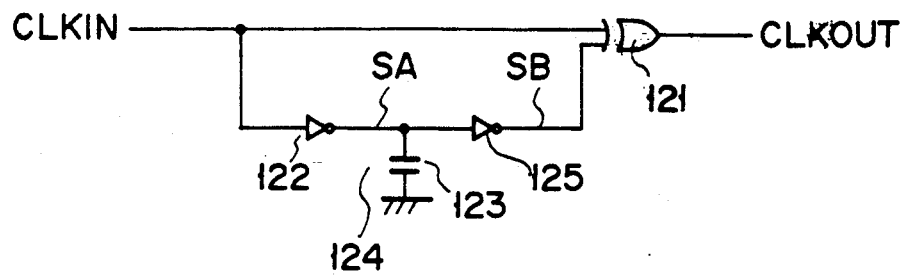
(PRIOR ART)
F I G. 1
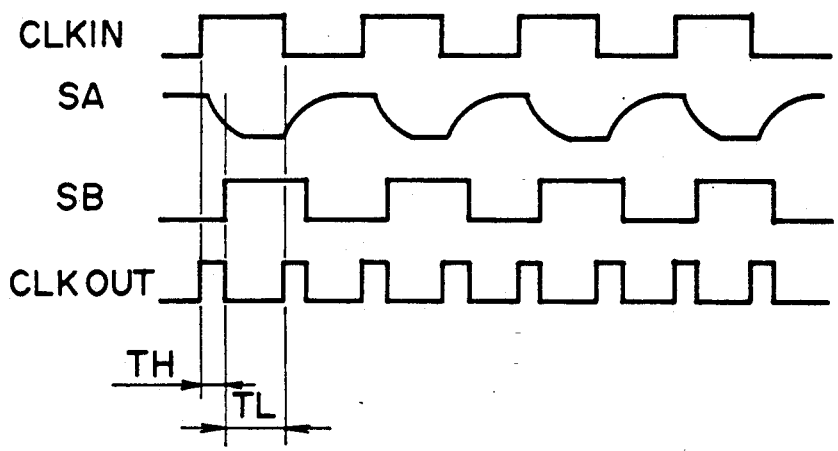
(PRIOR ART)
F I G. 2
| CLKIN | SB | CLKOUT |
|---|---|---|
| 0 | 0 | 0 |
| 1 | 0 | 1 |
| 0 | 1 | 1 |
| 1 | 1 | 0 |
(PRIOR ART)
F I G. 3

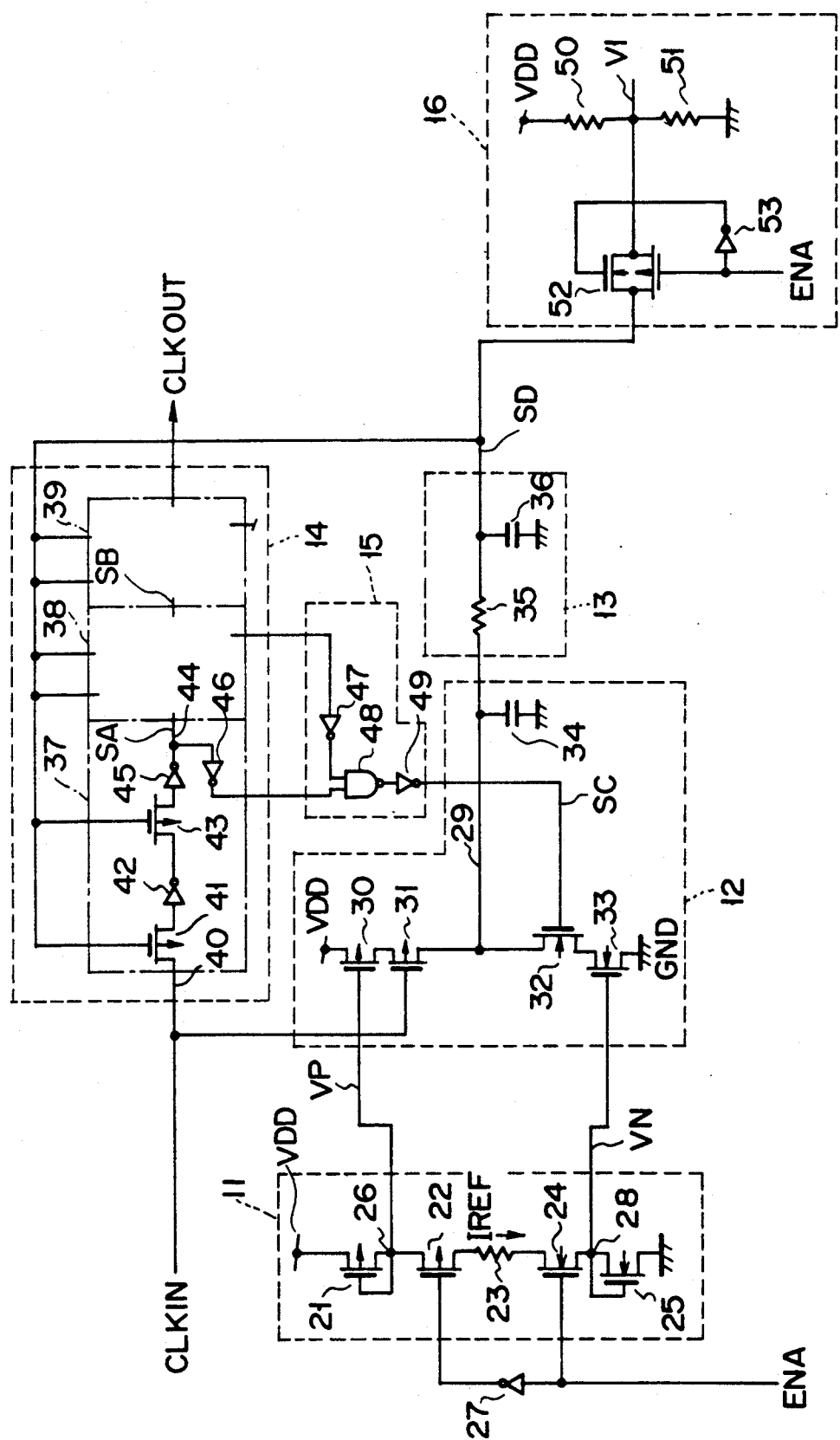
F I G. 7

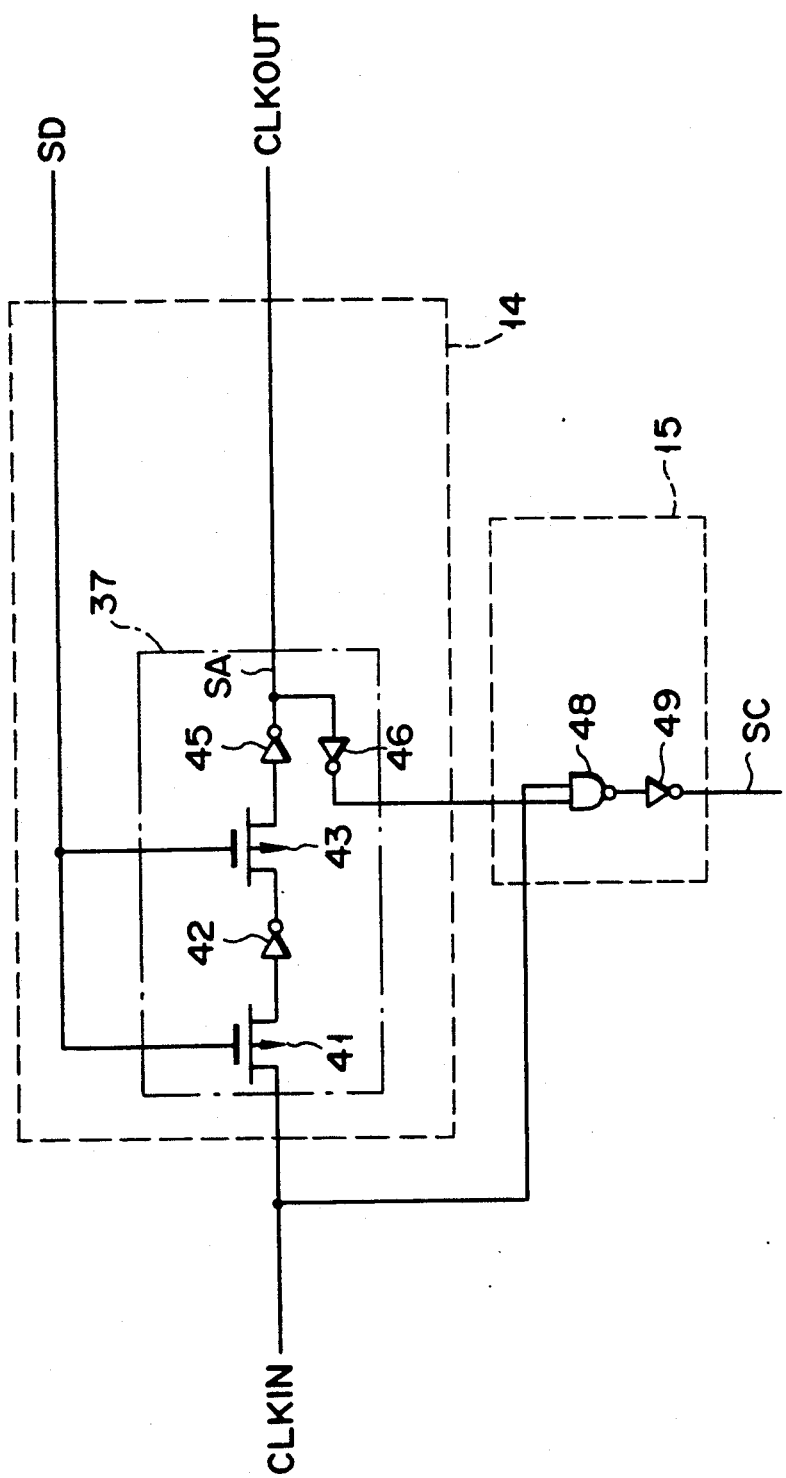
F I G. 12

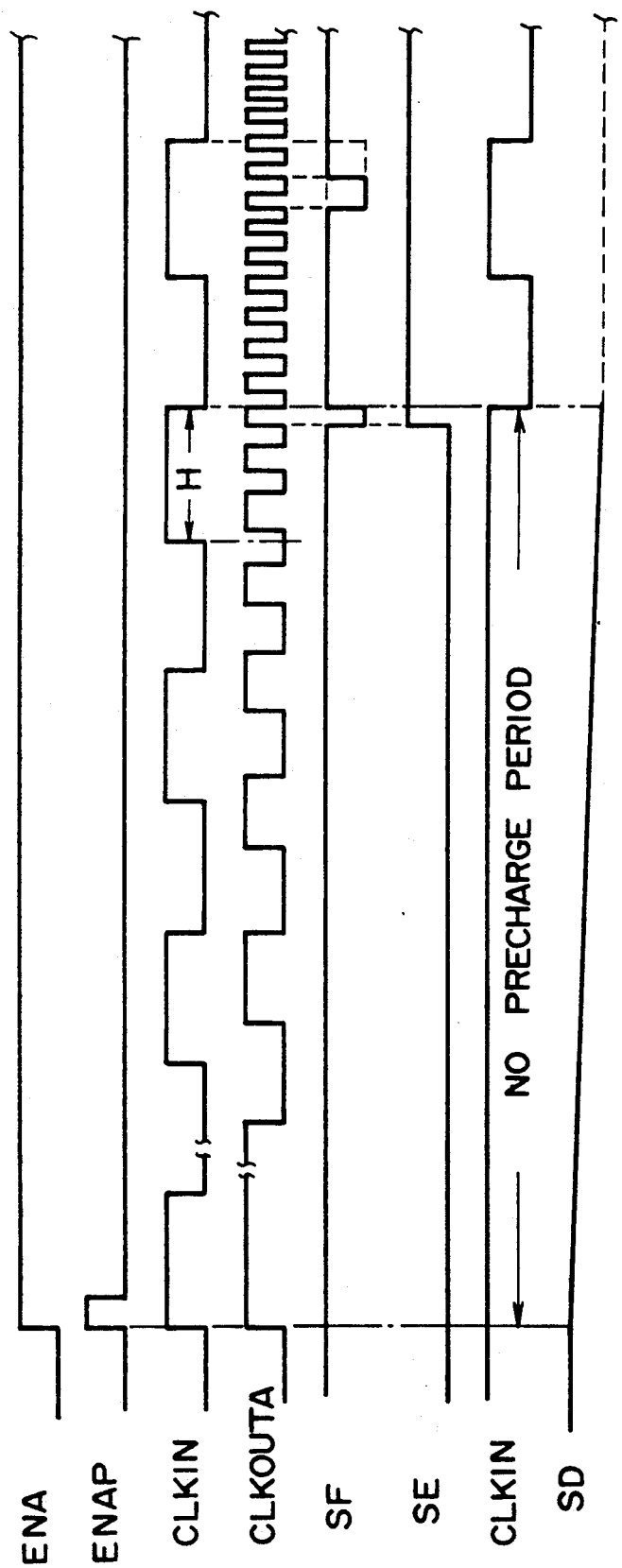
F I G. 17

PHASE-LOCKED LOOP CLOCK SIGNAL GENERATOR

BACKGROUND OF THE INVENTION

1. Field of the Invention

The present invention relates to a phase-locked loop clock signal generator.

2. Description of the Related Art

A frequency multiplying circuit for outputting a clock signal having a frequency twice that of an input signal, a phase-locked loop circuit, having an oscillator, for detecting a phase difference between input and output signals and performing a feedback control operation such that the frequency of the oscillator is always set to be several times that of an input signal and the phases of the input and output signals from the oscillator are locked to each other, and the like are arranged in a semiconductor integrated circuit as needed.

FIG. 1 is a circuit diagram showing an arrangement of a conventional frequency multiplying circuit which is a kind of a clock signal generator. FIG. 2 is a timing chart of the frequency multiplying circuit. An input clock signal CLKIN is supplied to one input terminal of an exclusive OR circuit 121 and an delay circuit 124 constituted by an inverter 122 and a capacitor 123. A delay output signal SA from the delay circuit 124 is supplied to an inverter 125. An output signal SB from the inverter 125 is supplied to the other input terminal of the exclusive OR circuit 121. A multiplied clock signal CLKOUT is obtained from the exclusive OR circuit 121.

FIG. 3 is a truth table showing logic states of input and output signals of the exclusive OR circuit 121. When the clock signal CLKIN and the output signal SB from the inverter 125 are input to the exclusive OR circuit 121, as shown in the timing chart of FIG. 2, the clock signal CLKOUT having a frequency twice that of the input clock signal CLKIN can be obtained.

FIG. 4 is a block diagram schematically showing an arrangement of a conventional phase-locked-loop (to be referred to as a PLL hereinafter) digital frequency synthesizer which is a kind of a clock signal generator. The oscillation frequency of a VCO (Voltage-Controlled Oscillator) 131 is controlled in accordance with the output potential of a low-pass filter 132, and the VCO 131 oscillates at a frequency higher than a reference input frequency fREF (the frequency fREF is N times the reference input frequency). The frequency f0 (=NfREF) obtained from the VCO 131 is supplied to other circuits requiring this frequency and is 1/N-divided by a frequency divider 133 to be input to a phase detector (phase comparator) 134. In the phase detector 134, the phase and frequency of the 1/N-divided frequency fREF is compared with the reference input frequency, and the comparison result is fed back to the VCO 131 through the low-pass filter 132. With the above arrangement, a high-frequency signal having a phase difference according to the reference input frequency can be obtained.

FIG. 5 shows a circuit arrangement of the phase detector used in the frequency synthesizer in FIG. 4. As shown in FIG. 5, the well-known edge-triggered phase detector constituted by several NAND gates and several inverters is used. In FIG. 5, reference symbol R denotes the reference input frequency, and reference symbol V denotes a frequency 1/N-divided by the frequency divider 133.

In the frequency multiplying circuit in FIG. 1, the input clock signal CLKIN is delayed and the output clock signal CLKOUT is obtained by using a phase difference between two input signals from the exclusive OR circuit 121. However, the characteristics of the inverter and the capacitances of the capacitor for obtaining a predetermined delay amount depend on variations in manufacturing conditions, and the characteristics of the inverter also depend on a power source voltage used and an ambient temperature. For this reason, the delay amount is not uniformed. Therefore, an "H"-level period (TH in FIG. 2) and an "L"-level period (TL in FIG. 2) of the output clock signal CLKOUT are changed every time these conditions are changed. In the worst case, the output clock signal CLKOUT becomes a so-called glitch-like signal in which the "H"-level period and "L"-level period are almost eliminated. According to circumstances, the signal may be continuously set at "H" level or "L" level.

In the frequency synthesizer in FIG. 4, since the edge-triggered phase detector is used, when a waveform division portion is formed in the reference input frequency due to noise or the like, this portion is erroneously counted as a part of the frequency. In addition, when the phase detector itself is incorporated in a semiconductor circuit device, in order to improve accuracy of phase comparison, symmetry between the circuit patterns of R and V input sides of the circuit in FIG. 5 is required. For this reason, a pattern area required for a phase divider is increased, and a chip area is disadvantageously increased.

In the frequency synthesizer in FIG. 4, since a frequency division ratio in the frequency divider must be set to be an integer, the output frequency f0 is limited to an integer multiple of the frequency fREF, and the output frequency f0 cannot have a decimal part, e.g., N=99.4 or N=15.6. Therefore, when the frequency fREF must be multiplied by a multiplier having a decimal part, the multiplier is rounded off, and frequency division is performed using the rounded multiplier, e.g., N=99 or N=16. However, in this case, since the multiplier N includes an error in advance, the error causes a problem such as jitter.

As described above, in the conventional clock signal generator, an output clock signal is not stably obtained by an influence of variations in manufacturing conditions or an influence of variations in application conditions due to voltage dependency.

In the conventional clock signal generator, especially in a digital frequency synthesizer, since an erroneous operation is easily performed by noise of an input clock signal, a special care must be taken for a circuit pattern. Therefore, the following drawbacks are caused. That is, a chip area is increased, a manufacturing cost is increased, and an output clock signal having a frequency which is an arbitrary number of times the input frequency and has a decimal part cannot be obtained.

SUMMARY OF THE INVENTION

The present invention has been made in consideration of the above problem, and has its object to provide a signal delay circuit capable of always obtaining a predetermined delay amount without an influence of variations in manufacturing conditions or an influence of variations in application conditions due to voltage dependency.

It is another object of the present invention to provide a clock signal generator capable of always stably obtaining an output clock signal without an influence of variations in manufacturing conditions or an influence of variations in application conditions due to voltage dependency.

It is still another object of the present invention to provide an integrated circuit system in which when clock signals are used in a plurality of integrated circuits, plural types of clock signals are generated in one integrated circuit, and these clock signals are distributed to other integrated circuits, thereby reducing the size and power consumption of the system.

According to the present invention, there is provided a signal delay circuit comprising variable delay means for delaying an input signal by a time according to a control signal to output the signal, a logic circuit for detecting a signal delay amount of the variable delay means, a charge pump circuit, having a capacitor, for generating a DC voltage by controlling charging and discharging operations of the capacitor by a current an arbitrary number of times a reference current on the basis of the input signal and a detection signal from the logic circuit to apply the DC voltage to the variable delay means as the control signal, the charge pump circuit being set so that a power ratio of a charging current to a discharging current is set to be a reciprocal of a pulse width ratio of the input signal to the detection signal from the logic circuit, and initial value setting means for setting an initial value of the control signal.

According to the present invention, there is provided a clock signal generator comprising first variable delay means, constituted by at least one delay stage in which a signal delay time is controlled on the basis of a control signal, for delaying an input signal to obtain an output signal, a logic circuit for detecting a signal delay amount of the first variable delay means, a charge pump circuit, having a capacitor, for generating a DC voltage by controlling charging and discharging operations of the capacitor by a current an arbitrary number of times a reference current on the basis of the input signal and a detection signal from the logic circuit to apply the DC voltage to the first variable delay means as the control signal, the charge pump circuit being set so that a power ratio of a charging current to a discharging current is set to be a reciprocal of a pulse width ratio of the input signal to the detection signal from the logic circuit, initial value setting means for setting an initial value of the control signal, second variable delay means constituted by at least one delay stage having the same arrangement as that of the delay stage in the first variable delay means and a signal delay time controlled on the basis of a control signal generated by the charge pump circuit, and feedback means for feeding back an output from a delay stage serving as a last stage to a delay stage serving as a first stage in the second variable delay means.

According to the present invention, there is provided a clock signal generator comprising first variable delay means, constituted by at least one delay stage in which a signal delay time is controlled on the basis of a control signal, for delaying an input signal to obtain an output signal, a logic circuit for detecting a signal delay amount of the first variable delay means, second variable delay means constituted by at least one delay stage having the same arrangement as that of the delay stage of the first variable delay means and a signal delay time controlled on the basis of the control signal, a charge pump circuit, having a capacitor, for generating a DC voltage by controlling charging and discharging operations of the capacitor by a predetermined current to apply the DC voltage to the first and second variable delay means as the control signal, feedback means feeding back an output from the second variable delay means to an input side of the second variable delay means and constituting an oscillator for obtaining a clock signal together with the second variable delay means, frequency detecting means for detecting an oscillation frequency of the oscillator, and control means for continuously performing or stopping a charging or discharging operation of the capacitor in the charge pump circuit for a predetermined period in accordance with an output from the frequency detecting means.

According to the present invention, there is provided an integrated circuit system comprising a first integrated circuit having a clock signal generator, and at least one second integrated circuit for receiving a clock signal generated by the clock signal generator in the first integrated circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram showing a conventional frequency multiplying circuit;

FIG. 2 is a timing chart of the frequency multiplying circuit in FIG. 1;

FIG. 3 is a truth table showing logic states of input-/output signals of an exclusive OR circuit used in the frequency multiplying circuit in FIG. 1;

FIG. 7 is a circuit diagram showing an arrangement of a signal delay circuit according to the first embodiment of the present invention;

FIG. 12 is a circuit diagram showing a modification of the circuit shown in FIG. 11;

FIG. 17 is a timing chart of the circuit in FIG. 16;

DETAILED DESCRIPTION OF THE PREFERRED EMBODIMENTS

An embodiment of the present invention will be described below with reference to the accompanying drawings.

Figure 4:
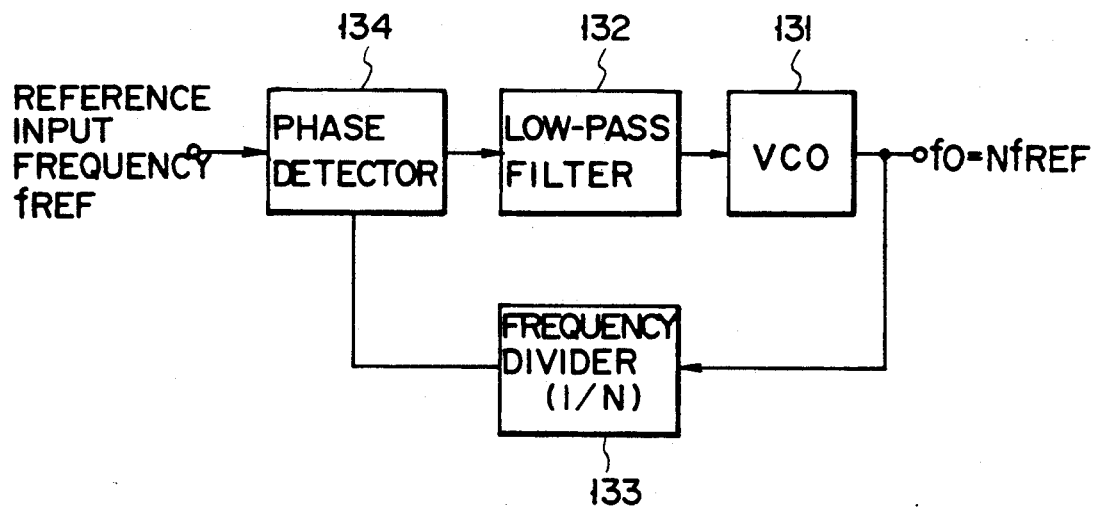
FIG. 4 is a block diagram schematically showing a conventional digital frequency synthesizer.
Figure 5:
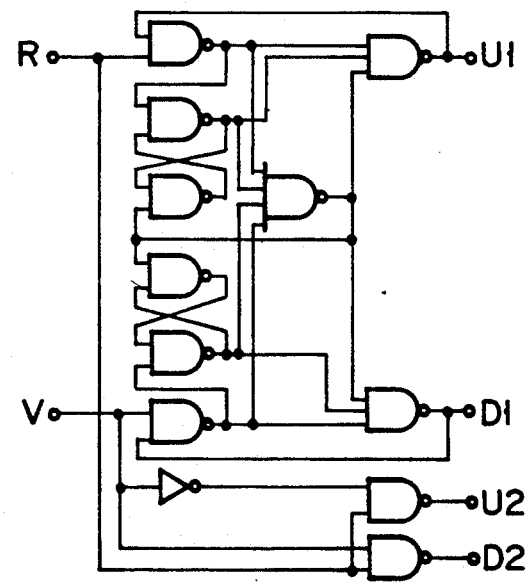
FIG. 5 is a detailed circuit diagram showing a phase detector used in the frequency synthesizer in FIG. 4.
Figure 6:
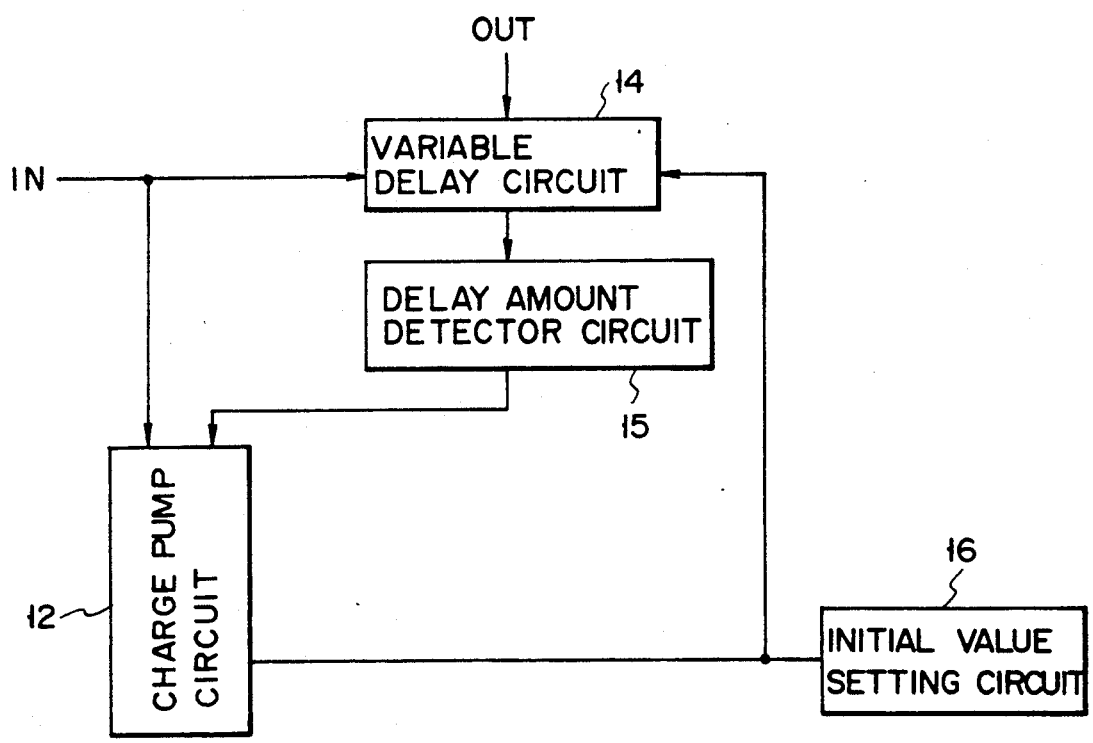
FIG. 6 is a block diagram for explaining a principle of a signal delay circuit according to the present invention.

In FIG. 6, reference symbol IN denotes an input signal having a predetermined frequency. The input signal IN is supplied to a variable delay circuit 14. The variable delay circuit 14 has at least one delay stage and sequentially delays the input signal IN in the delay stage. A delay amount of the input signal IN is set in accordance with a control signal to be described later. An output from the variable delay circuit 14 is supplied to a delay amount detector circuit 15, and the delay amount of the input signal IN is detected by the delay amount detector circuit 15. An output from the delay amount detector circuit 15 and the input signal IN are supplied to a charge pump circuit 12. The charge pump circuit 12 has a capacitor to be described later. The capacitor is charged for a pulse period of the input signal IN and discharged for a pulse period of the output from the delay amount detector circuit 15 so that a charge amount and a discharge amount of the above capacitor equal to each other. A predetermined DC voltage is generated in accordance with a current power ratio between a current power upon charge and a current power upon discharge. The generated DC voltage is fed back to the variable delay circuit 14 as the above control signal. Note that the output from the charge pump circuit 12 is smoothed via a low-pass filter circuit, as needed, and is supplied to the variable delay circuit 14.

A constant DC voltage output from an initial voltage setting circuit 16 is applied to a path of the control signal output from the charge pump circuit 12. The voltage output from the initial voltage setting circuit 16 is set to be a value so that a desired amount is obtained in each delay stage of the variable delay circuit 14, and the initial voltage setting circuit 16 supplies an initial value to the control signal.

Various embodiments of the present invention will be described in detail below.

FIG. 7 is a circuit diagram showing a circuit according to the first embodiment of the present invention using the signal delay circuit in FIG. 6. The signal delay circuit comprises a reference current setting circuit 11, a charge pump circuit 12, a low-pass filter circuit 13, a variable delay circuit 14, a delay amount detector circuit 15, and the initial voltage setting circuit 16.

The reference current setting circuit 11 sets reference current values of inflow and outflow currents with respect to a capacitor to be described later in charge pump circuit 12, and comprises two p-channel MOS transistors 21 and 22 inserted in series between an application point of a power source voltage VCC and an application point of a ground voltage GND, a resistor 23, and two n-channel MOS transistors 24 and 25. The gate of the transistor 21 is connected to its drain, i.e., a node 26 which is a series connection node between the transistors 21 and 22. An enable signal ENA for enabling the reference current setting circuit 11 is input to the gate of the transistor 22 via an inverter 27. The gate of the transistor 25 is connected to a node 28 which is a series connection node between the transistors 24 and 25. The enable signal ENA is input to the gate of the transistor 24.

In this circuit 11, when the enable signal ENA is set at "H" level, the transistors 22 and 24 are turned on to be set in an enable state. At this time, a predetermined DC current IREF flows in series through the four transistors 21, 22, 24, and 25 and the resistor 23. In order to lower this current value and to lower charge amounts due to charge and discharge currents in the charge pump circuit 12, the value of the resistor 23 is normally set much larger than ON resistances of the transistors 21, 22, 24, and 25 so that the value of IREF is determined by the value of the resistor 23. When the current IREF flows, voltages VP and VN are generated from the nodes 26 and 28, respectively. The voltages VP and VN are applied to the charge pump circuit 12.

The charge pump circuit 12 comprises two p-channel MOS transistors 30 and 31 inserted in series between the application point of the power source voltage VDD and an output node 29, two n-channel MOS transistors 32 and 33 inserted in series between the output node 29 and the application point of the ground voltage GND, drain capacitances of the transistors 31 and 32 present at the output node 29, and a parasitic capacitance 34 consisting of a wiring capacitance or the like. Note that the above parasitic capacitance 34 may be replaced with a real capacitor.

The voltages VP and VN output from the reference current setting circuit 11 are applied to the gates of the transistors 30 and 33, respectively. An input signal CLKIN having a predetermined frequency is supplied to the gate of the transistor 31. In addition, an output signal SC output from the delay amount detector circuit 15 is supplied to the gate of the transistor 32.

The transistor 30 constitutes a current mirror circuit together with the transistor 21 in the reference current setting circuit 11. A current flowing through the transistor 30 is determined on the basis of the value of the reference current IREF, a size ratio between the transistors 21 and 30, and a size ratio between the transistors 22 and 31. For example, assuming that a W/L (ratio of a channel width to a channel length: the current power of a transistor is determined by this value) of the transistor 21 is 1, the W/L of the transistor 30 is set to be A1 (which is a positive value). Similarly, the transistor 33 in the charge pump circuit 12 constitutes a current mirror circuit together with the transistor 25 in the reference current setting circuit 11. The value of a current flowing through the transistor 33 is determined on the basis of the value of the reference current IREF and a size ratio between the transistors 25 and 33 or between the transistor 24 and 32 according to circumstances. For example, assuming that the W/L of the transistor 25 is 1, the W/L of the transistor 33 is set to be A2 (which is positive value).

In the circuit 12 having the above arrangement, the transistors 30 and 31 cause a current to flow in the capacitor 34. While the transistor 31 is kept on when the input signal CLKIN is set at "L" level, the capacitor 34 is charged by a current having a value determined by the transistor 30. The two n-channel MOS transistors 32 and 33 cause a current to flow out from the capacitor 34. While the transistor 32 is kept on when the output signal SC output from the delay amount detector circuit 15 is set at "H" level, the capacitor 34 is discharged by a current having a value determined by the transistor 33.

The low-pass filter circuit 13 obtains a DC voltage by smoothing a voltage of the output node 29 of the charge pump circuit 12, i.e., a terminal voltage of the capacitor 34, and comprises a resistor 35 and a capacitor 36. When the value of the capacitor 34 is sufficiently large, the capacitor 36 or the resistor 35 in the low-pass filter 13 or the low-pass filter circuit 13 itself is not sometimes required. An output signal SD from the low-pass filter circuit 13 is supplied to the variable delay circuit 14.

The variable delay circuit 14 is constituted by cascade-connecting, e.g., three delay stages 37, 38, and 39 having the same arrangement. The input clock signal CLKIN is supplied to the first delay stage 37. Output signals SA and SB from the delay stages 37 and 38 are sequentially supplied to the subsequent stages as input signals. An output signal from the last delay stage 39 is extracted as a delay clock signal CLKOUT.

Each of the delay stages 37, 38, and 39 comprises a p-channel MOS transistor 41 having one terminal connected to an input node 40, an inverter 42 having an input terminal connected to the other terminal of the transistor 41, a p-channel MOS transistor 43 having one terminal connected to the output terminal of the inverter 42, an inverter 45 having an input terminal connected to the other terminal of the transistor 43 and an output terminal connected to an output node 44, and an inverter 46 having an input terminal connected to the output node 44. The output signal SD from the low-pass filter circuit 13 is supplied in parallel to the gates of the transistors 41 and 43 of each of the delay stages 37, 38, and 39.

The delay amount detector circuit 15 is for obtaining the signal SC and comprises an inverter 47 for inverting an output signal from the inverter 46 of the delay stage 38, a NAND gate 48 for receiving an output signal from the inverter 47 and an output signal from the inverter 46 of the delay stage 37, and an inverter 49 for inverting an output signal from the NAND gate 48.

The initial voltage setting circuit 16 comprises two resistors 50 and 51 inserted in series between the application point of the power source voltage VDD and the application point of the ground voltage GND to generate a voltage V1 obtained by dividing the power source voltage VDD at a predetermined resistance ratio, a transmission gate 52 constituted by p- and n-channel MOS transistors for outputting the divided voltage V1 to a node of the output signal SD of the low-pass filter circuit 13 in accordance with the enable signal ENA, and an inverter 53 for inverting the enable signal ENA. Note that the voltage V1 is set to be an approximate value obtained such that a desired delay amount is obtained in each delay stage of the variable delay circuit 14.

An operation of the circuit having the above arrangement will be described below with reference to a timing chart shown in FIG. 8. Assuming that the enable signal ENA is set at "H" level, the transistors 22 and 24 in the reference current setting circuit 11 are turned on so as to set the reference current setting circuit 11 in an operating state. Assume that the transistor 31 of the charge pump circuit 12 is to be turned on. In this case, the input clock signal CLKIN is in an "L"-level period. Assuming that this "L"-level period is t1, a charge amount QH charged in the capacitor 34 within the period t1 is given by the following equation:

$$QH = IREF \cdot A1 \cdot t1 \qquad 1$$

Assume that the transistor 32 of the charge pump circuit 12 is to be turned on. In this case, the output signal SC from the delay amount detector circuit 15 is in an "H"-level period. Assuming that this "H"-level period is t2, a discharge amount QL of the capacitor 34 within the period t2 is given by the following equation:

$$QL = IREF \cdot A2 \cdot t2 \qquad 2$$

If a ratio t1/t2 coincides with a ratio A2/A1, QH is given by the following equation:

$$\begin{aligned} QH &= IREF \cdot A1 \cdot t1 \\ &= IREF \cdot A1 \cdot \{(A2/A1)yt2\} \\ &= IREF \cdot A2 \cdot t2 = QL \end{aligned} \qquad 3$$

If t1/t2 = A2/A1 as described above, i.e., if a current power ratio between the transistors 30 and 33 coincides with a reciprocal of a pulse width ratio between the input signal CLKIN and the output signal SC from the delay amount detector circuit 15, a charge amount flowing in the capacitor 34 is equal to that flowing out from the capacitor 34, and a voltage value of the output signal SD from the low-pass filter circuit 13 is determined to be a certain arbitrary value. At this time in each delay stage of the variable delay circuit 14 which receives the signal SD, ON resistances of the transistors 41 and 43 become predetermined values, and the delay amount in each delay stage becomes a predetermined value.

Assuming that the value of A1 of the transistor 30 is set to be 2, the value of the A2 of the transistor 33 is set to be 8, and the value of A2/A1 is set to be 4 in the charge pump circuit 12, an operation of the circuit of this embodiment becomes stable when t1/t2 = 4, i.e., t1 = 4·t2.

Assuming that t1 > 4·t2 is obtained, a difference QD between the charge amounts to be charged to and discharged from the capacitor 34 of the charge pump circuit 12 is given by the following equation:

$$\begin{aligned} QD &= IREF \cdot A1 \cdot t1 - IREF \cdot A2 \cdot t2 \\ &= IREF \cdot A1 \cdot t1 - 4IREF \cdot A1 \cdot t2 \\ &= IREF \cdot A1(t1 - 4t2) \end{aligned} \qquad 4$$

Since t1 > 4·t2, QD of the equation 4 is obtained as QD > 0. That is, in this case, the charge amount of the capacitor 34 is larger than its discharge amount, and a voltage value of the output signal SD from the low-pass filter circuit 13 rises. As a result, ON resistances 41 and 43 in each delay stage of the variable delay circuit 14 rise to increase the delay amount of a signal in each delay stage. That is, t2 as a delay time difference between the signals SA and SB shown in FIG. 8 is increased. This stage continues from a state of $t1 > 4 \cdot t2$ to a state of $t1 = 4 \cdot t2$. When the state of $t1 = 4 \cdot t2$ is obtained, the charge and discharge amounts of the capacitor 34 become equal to each other, and the rise in voltage of the signal SD is stopped and stabilized.

To the contrary, assuming that $t1 < 4 \cdot t2$ is obtained, the charge amount difference QD given the above equation 4 is obtained as $QD < 0$, and the discharge amount of the capacitor 34 becomes larger than its charge amount. Therefore, the voltage of the output signal SD from the low-pass filter circuit 13 drops to reduce the ON resistances of the transistors 41 and 43 in each delay stage of the variable delay circuit 14. Therefore, the delay amount in each delay stage is decreased to reduce t2 as a delay time difference between the signals SA and SB. This state continues from a state of $t1 < 4 \cdot t2$ to a state of $t1 = 4 \cdot t2$. When the state of $t1 = 4 \cdot t2$ is obtained, the charge and discharge amounts of the capacitor 34 become equal to each other, and the voltage drop of the signal SD is stopped and stabilized.

In this manner, the delay amount t2 in each delay stage of the variable delay circuit 14 is always controlled to be a predetermined value on the basis of the ratio of A2 to A1 by a PLL loop constituted by the charge pump circuit 12, the low-pass filter circuit 13, the variable delay circuit 14, and the delay amount detector circuit 15. That is, in this embodiment, the delay amount corresponding to $\frac{1}{4}$ of the "L"-level period t1 of the input clock signal CLKIN can be obtained in each delay state, and the delay time of the output clock signal CLKOUT with respect to the input clock signal CLKIN is obtained as $3 \cdot t2$.

When the enable signal ENA is set at "L" level, i.e., in an initial state, since a transmission gate 52 in the initial voltage setting circuit 16 is set in an ON state, a divided voltage V1 obtained by resistors 50 and 51 is output to a node of the output signal SD from the low-pass filter circuit 13. Thereafter, when the enable signal ENA goes to "H" level and the PLL loop starts to operate as described above, the value of the output signal SD is set to be a predetermined value. For this reason, thereafter, the voltage value of the output signal SD can be immediately stabilized as a value to satisfy the state of $t1 = 4 \cdot t2$. As a result, according to the signal delay circuit of this embodiment, a desired signal delay amount can be obtained within a short time after the signal delay circuit is started.

In this embodiment, the ratio of A2 to A1 (A2/A1) is set to be 4, and the three delay stages are provided in the delay circuit 14, thereby obtaining the delay time of $3 \cdot t2$. Various delay times, however, can be obtained by increasing/decreasing the value of A2/A1 and the number of delay stages in the delay circuit 14 as needed.

Figure 9:
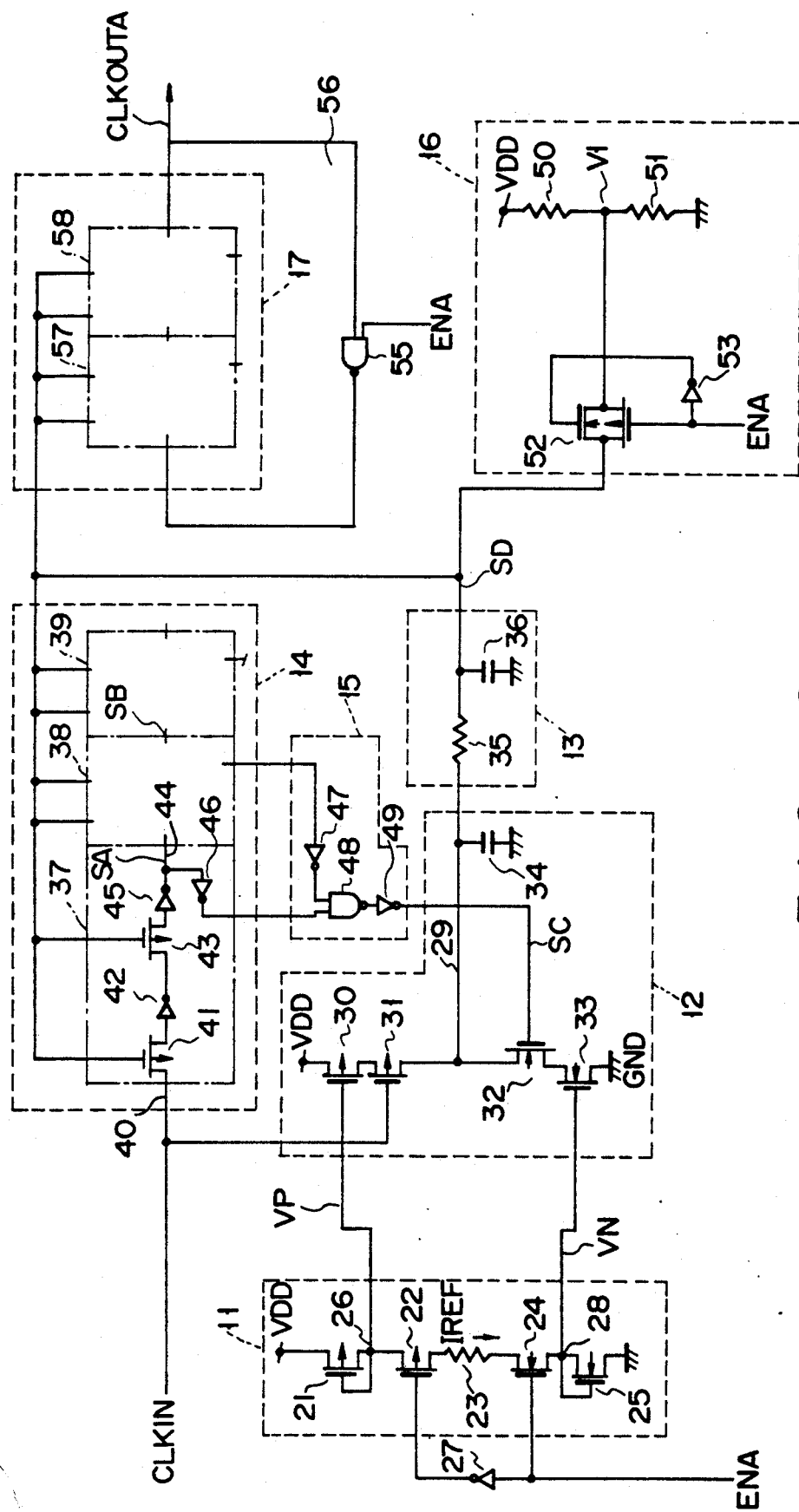
FIG. 9 is a circuit diagram showing an arrangement of a clock signal generator according to the second embodiment of the present invention.

FIG. 9 is a circuit diagram showing an arrangement of a clock signal generator according to the second embodiment of the present invention using the signal delay circuit in FIG. 6. In the circuit in FIG. 9, a ring oscillator 56 is constituted such that a variable delay circuit 17 and a NAND gate 55 serving as a feedback means for feeding back an output signal from the variable delay circuit 17 to its input side are added to a variable delay circuit 14.

The variable delay circuit 17 is constituted by two cascade-connected stages 57 and 58 having the same arrangement as that of the three delay stages 37, 38, and 39 in the variable delay circuit 14. As in the variable delay circuit 14, an output signal SD from a low-pass filter circuit 13 is supplied in parallel to the gates of two transistors 41 and 43 in each of the delay stages 57 and 58.

An output clock signal CLKOUTA and an enable signal ENA from the variable delay circuit 17 are input to the NAND gate 55, and an output from the NAND gate 55 is fed back on the input side of the variable delay circuit 17.

Figure 10:
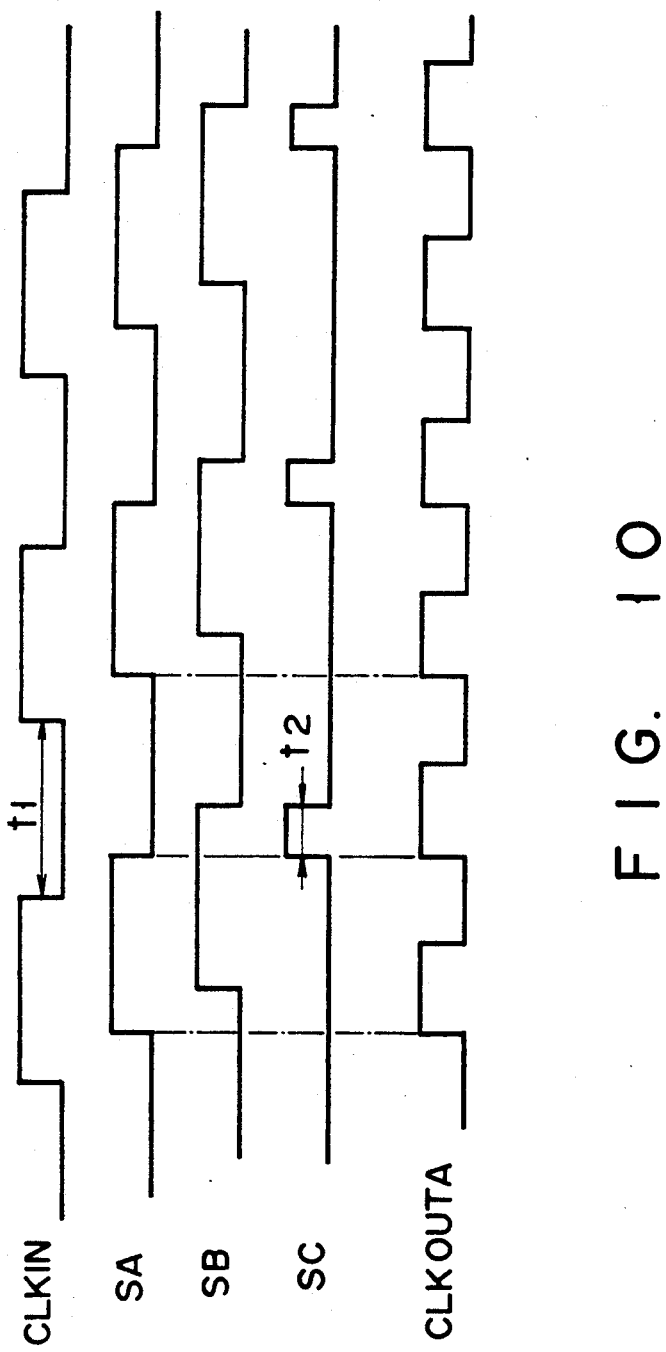
FIG. 10 is a timing chart of the circuit of the second embodiment in FIG. 9.

In the clock signal generator of the second embodiment, when the ratio A2/A1 is set to be 4, each delay stage in the variable delay circuits 14 and 17 has a delay amount corresponding to $\frac{1}{4}$ period of a clock signal CLKIN. At this time, the variable delay circuit 17 constituted by the two delay stages 57 and 58 delays an output from the NAND gate 55 as an input signal by $\frac{1}{4}$ period $\times 2$ stages $= \frac{1}{2}$ period. The NAND gate 55 is operated as an inverter while the enable signal ENA is set at "H" level. For this reason, the frequency of the output signal CLKOUTA from the ring oscillator 56, i.e., an oscillation frequency f becomes 1/(time corresponding to the $\frac{1}{4}$ period of the input clock signal $\times 2$ stages $\times 2$). That is, the frequency f of the output signal CLKOUTA is twice the frequency of the input signal CLKIN. FIG. 10 is a timing chart of the circuit of the second embodiment.

In the clock signal generator according to the second embodiment, a signal having a frequency twice that of an input signal can be extracted. In this embodiment, since a delay amount of each delay stage is controlled to be predetermined by a PLL loop, the frequency of the output signal CLKOUTA is not adversely affected by variations in manufacturing conditions or the like but can be stabilized. In addition, when the enable signal ENA is set at "L" level, i.e., in an initial state, a transmission gate 52 in an initial voltage setting circuit 16 is set in an ON state, and a divided voltage V1 obtained by two resistors 50 and 51 is supplied to a node of the output signal SD from the low-pass filter 13. Therefore, the enable signal ENA becomes an "H"-level signal. The output signal CLKOUTA having a desirable frequency can be obtained within a short time after the PLL loop is operated.

Figure 11:
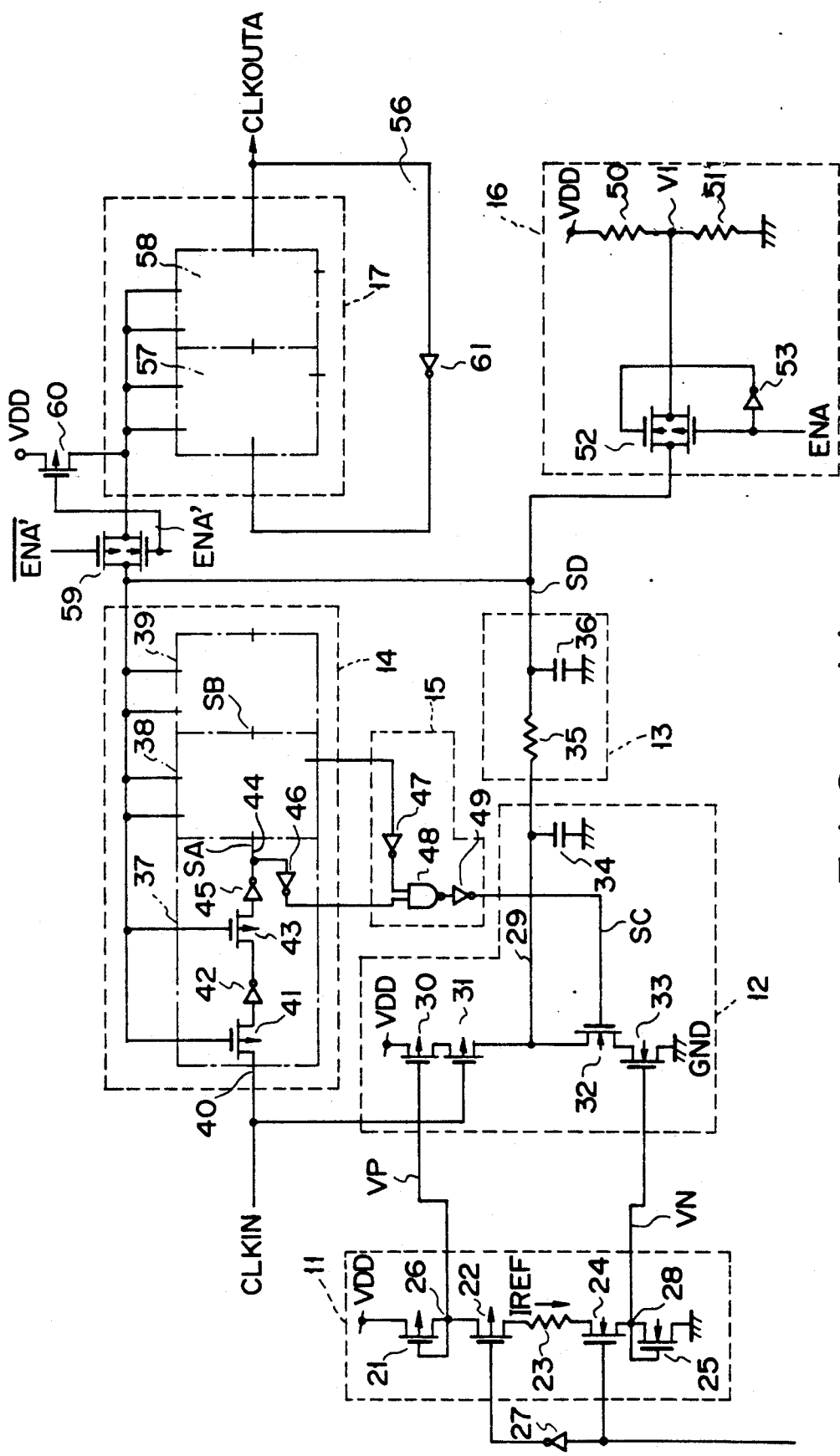
FIG. 11 is a circuit diagram showing an arrangement of a clock signal generator according to the third embodiment of the present invention.

FIG. 11 is a circuit diagram showing an arrangement of a clock signal generator according to the third embodiment of the present invention. In the circuit of the third embodiment, an output signal SD from a low-pass filter circuit 13 is supplied to a variable delay circuit 17 through a transmission gate 59 constituted by p- and n-channel MOS transistors, and a p-channel MOS transistor 60 is inserted between a path of the variable delay circuit 17 for the signal SD and a power source voltage VDD.

In the third embodiment, as a feedback means for feeding back an output signal from the variable delay circuit 17 to its input side, an inverter 61 is used in place of the NAND gate 55 of the second embodiment.

The transmission gate 59 is controlled by enable signals ENA' and $\overline{\text{ENA}}'$ activation of which is delayed by a predetermined time from the activation of enable signals ENA and $\overline{\text{ENA}}$. The enable signal ENA' is supplied to the gate of the MOS transistor 60.

With the above arrangement, when the enable signal ENA is set at "L" level and a divided voltage V1 is output from an initial voltage setting circuit 16 to the node of the output signal SD from the low-pass filter circuit 13, the transmission gate 59 is set in an OFF state, and the MOS transistor 60 is set in an ON state. Therefore, a path of the variable delay circuit for the signal SD is set at "H" level through the MOS transistor 60 set in an ON state, and the oscillating operation of a ring oscillator 56 constituted by the variable delay circuit 17 and the inverter 61 is stopped. The enable signal ENA goes to "H" level, and the PLL loop is operated. Thereafter, when a desired delay amount can be obtained in the variable delay circuit 14, the enable signals ENA' and $\overline{\text{ENA}}$' are activated. That is, the signal ENA' is set at "H" level, and the signal $\overline{\text{ENA}}$' is set at "L" level. For this reason, the transmission gate 59 is turned on, the MOS transistor 60 is turned off, and the output signal SD from the low-pass filter circuit 13 is supplied to the variable delay circuit 17 to start the oscillating operation of the ring oscillator 56.

With the above arrangement, immediately after the oscillating operation of the ring oscillator 56, frequency of an output signal CLKOUTA from the ring oscillator 56 becomes the approximate value of a desired value. For this reason, in another circuit (not shown) using the signal CLKOUTA, its operation is controlled by a clock signal having an approximately proper frequency to be stabilized.

FIG. 12 is a circuit diagram showing a modification of the circuit shown in FIG. 11. In the circuit shown in FIG. 12, the variable delay circuit 14 includes only one single delay stage, and an input clock signal CLKIN is input to the delay amount detector circuit 15. In the delay amount detector circuit 15, both the input clock signal CLKIN and output SA of the delay stage are supplied to the NAND gate 48, and an output of the NAND gate 48 is inverted by the inverter 49 to generate a signal SC.

Figure 13:
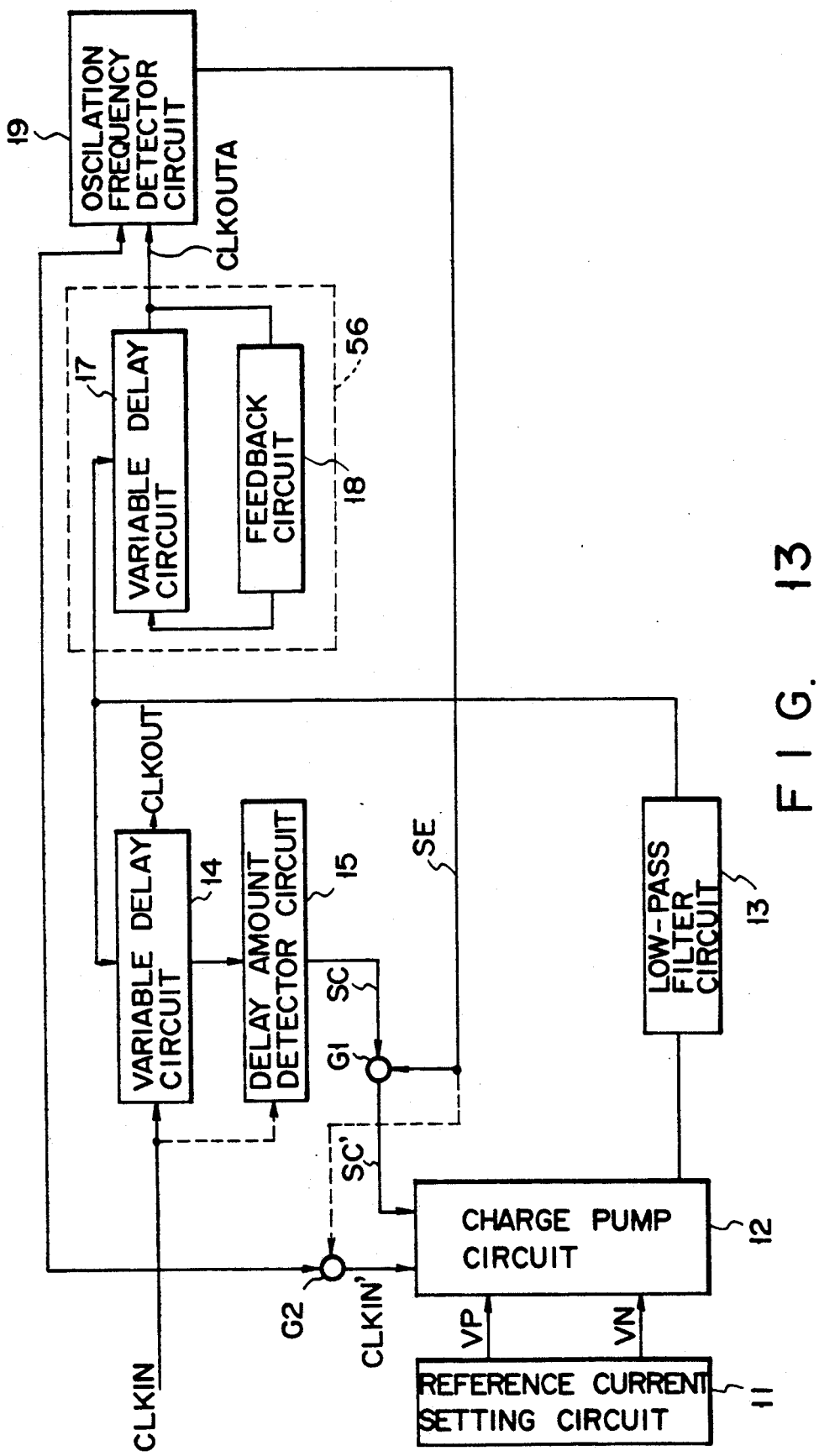
FIG. 13 is a block diagram showing an arrangement of a clock signal generator according to the fourth embodiment of the present invention.

FIG. 13 is a block diagram showing a clock signal generator according to the fourth embodiment of the present invention. The clock signal generator of this embodiment, comprises a reference current setting circuit 11, a charge pump circuit 12, a low-pass filter circuit 13, a variable delay circuit 14, a delay amount detector circuit 15 serving as a delay amount detecting means of each delay stage in the variable delay circuit 14, a variable delay circuit 17, a feedback circuit 18 for feeding back an output from the variable delay circuit 17 and constituting a ring oscillator together with the variable delay circuit 17, an oscillation frequency detector circuit 19, and one of two logic circuits G1 and G2. When only one delay stage is arranged in the variable delay circuit 14, an input signal CLKIN is input to the delay amount detector circuit 15 as indicated by a broken line in FIG. 13.

The input signal CLKIN having a predetermined frequency and an output signal CLKOUTA from the ring oscillator 56 are supplied to the oscillation frequency detector circuit 19. The oscillation signal detector circuit 19 generates a signal SE according to the frequency of the CLKOUTA. The signal SE is selectively supplied to the logic circuit G1 or G2.

The logic circuit G1 is arranged midway along a path for an output signal SC from the delay amount detector circuit 15. The logic circuit G1 controls the logic level of the signal SC in accordance with the output signal SE from the oscillation frequency detector circuit 19 to output the signal SC to the charge pump circuit 12 as a signal SC'. The logic circuit G2 may be arranged midway along a path for the input signal CLKIN to the charge pump circuit 12. The logic circuit G2 controls the logic level of the input signal CLKIN in accordance with the output signal SE from the oscillation frequency detector circuit 19 to supply the input signal CLKIN to the charge pump circuit 12 as a signal CLKIN'.

Figure 14:
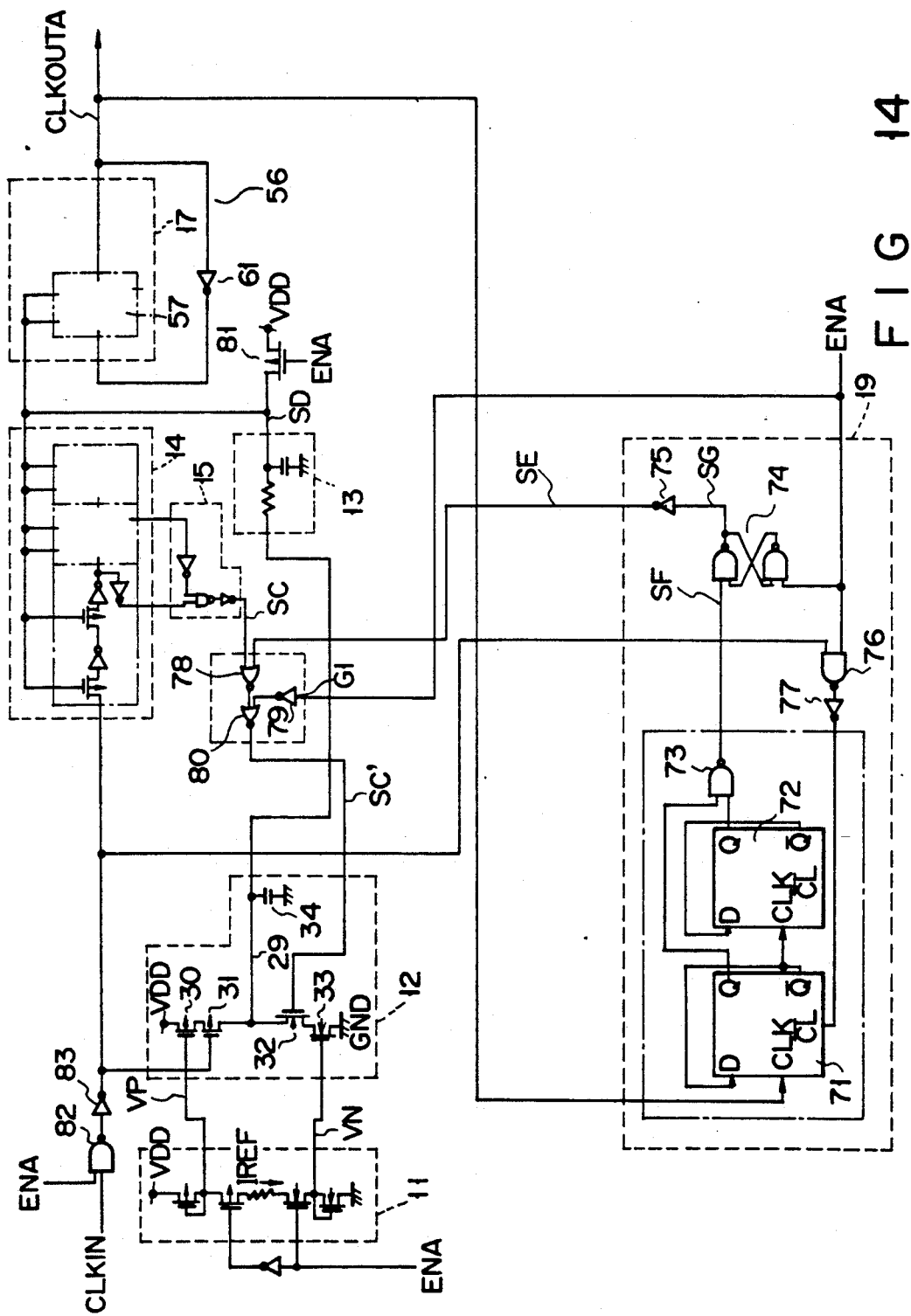
FIG. 14 is a detailed circuit diagram showing an arrangement of the circuit of the fourth embodiment in FIG. 13.

The fourth embodiment of the present invention will be described below using a circuit. FIG. 14 shows a detailed circuit arrangement of a clock signal generator in which the logic circuit G1 is arranged.

The oscillation frequency detector circuit 19 comprises two binary counter circuits 71 and 72, a NAND gate 73, a flip-flop circuit 74, an inverter 75, a NAND gate 76, and an inverter 77. In each of the two binary counter circuits 71 and 72, a signal from a Q output terminal is fed back to a D input terminal. In the binary counter circuits 71 and 72, a signal from the Q output terminal of the previous stage is supplied to the CLK (clock signal) input terminal of the subsequent stage. The binary counter circuits 71 and 72 constitute a quaternary counter. Signals from the Q output terminals of the binary counter circuits 71 and 72 are supplied in parallel to the NAND gate 73. The flip-flop circuit 74 is constituted by two NAND gates for receiving an output signal from the NAND gate 73 as one input and the enable signal ENA as the other input. The inverter 75 inverts an output from the flip-flop circuit 74 to generate the signal SE according to the frequency of the signal CLKOUTA. The enable signal ENA and input signal CLKIN are supplied to the NAND gate 76. The inverter 77 inverts an output from the NAND gate 76. The output signal CLKOUTA from a ring oscillator 56 is supplied to the CLK terminal of the first binary counter circuit 71, and an output from the inverter 77 is supplied in parallel to each CL (clear signal) input terminal of the binary counter circuits 71 and 72.

The logic circuit G1 comprises a NOR gate 78 for receiving an output signal SC from the delay amount detector circuit 15 and the output signal SE from the oscillation frequency detector circuit 19, an inverter 79 for inverting the enable signal ENA, and a NOR gate 80 for receiving output signals from the NOR gates 78 and 80. The output signal from the NOR gate 80 is supplied to the gate of a transistor 32 in a charge pump circuit 12 as a signal SC'.

In the circuit in FIG. 14, a p-channel MOS transistor 81 having a gate for receiving the enable signal ENA is inserted between a node of an output signal SD from the low-pass filter 13 and an application point of a power source voltage VDD. The input signal CLKIN and the enable signal ENA are supplied to a NAND gate 82. The input signal CLKIN is also supplied to each node through an inverter 83. Note that only one delay stage 57 is arranged in the variable delay circuit 17.

In the circuit in FIG. 14, when an oscillation frequency detector circuit 19 is not arranged, it is assumed that the value of a ratio A2/A1 of the value of A2 of a transistor 33 to the value of A1 of a transistor 30 in the charge pump circuit 12 is set to be 20. At this time, the output signal CLKOUTA from the ring oscillator 56 is to be stably oscillated with a frequency ten times the input signal CLKIN according to equations 1 to 4. However, immediately after the enable signal ENA is raised from "L" level to "H" level, the signal SD of the output node of the low-pass filter circuit 13 is initialized to the power source voltage VDD by the transistor 81. For this reason, the enable signal ENA is set at "H"

level to start the operation of the low-pass filter circuit 13, and the output signal SD from the low-pass filter circuit 13 drops. Therefore, a considerably long time is required to cause the voltage of the signal SD to reach a voltage at which the frequency of the signal CLKOUTA reaches a frequency ten times the frequency of the signal CLKIN to be stably oscillated. However, since the oscillation frequency detector circuit 19 is arranged in the circuit in FIG. 14, the time can be conspicuously shortened.

Figure 15:
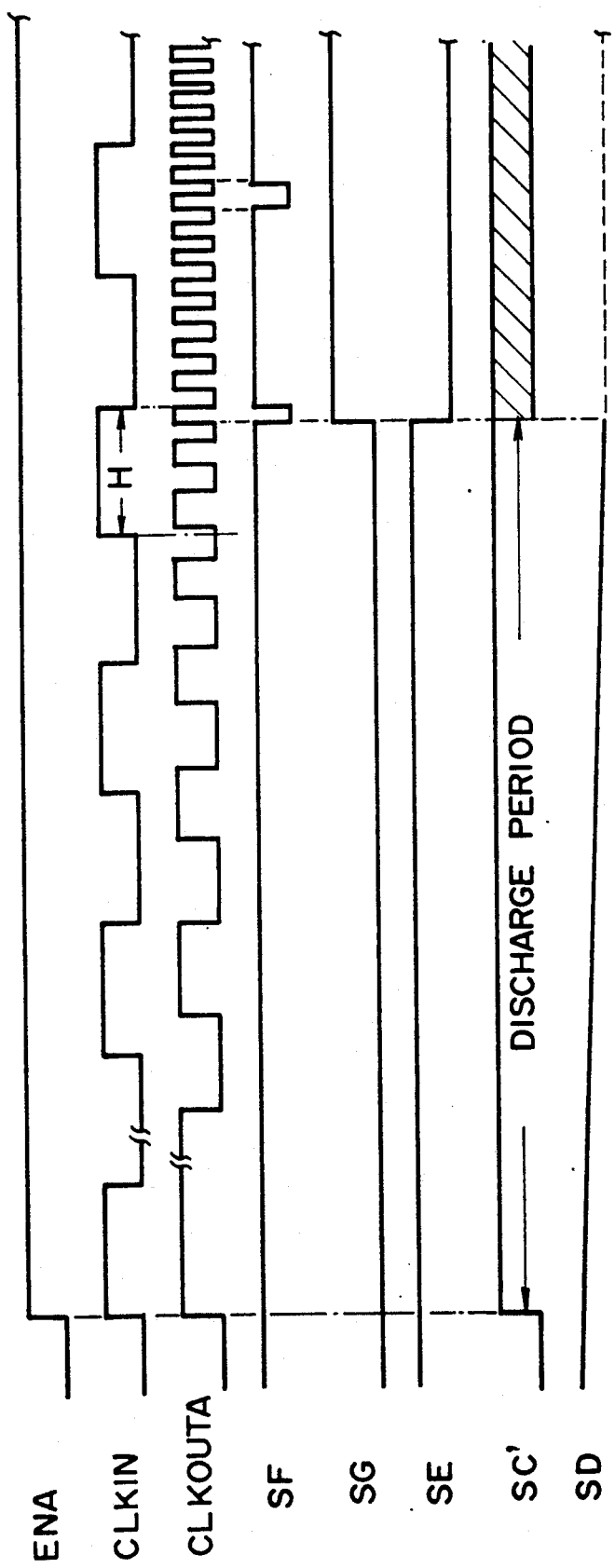
FIG. 15 is a timing chart of the circuit in FIG. 14.

An operation of the circuit in FIG. 14 will be described below with reference to the timing chart in FIG. 15.

As described above, the quaternary counter is arranged in the oscillation frequency detector circuit 19, and the signals CLKOUTA and CLKIN are supplied to the counter as an input clock signal and a clear input signal, respectively. An output signal SF from the NAND gate 73 is continuously set at "H" level from when the signal ENA goes to "H" level to start the operation of the circuit 19 to when the signal CLKOUTA has three pulses during an "H" period of the signal CLKIN. For this reason, an output SG from the flip-flop circuit 74 goes to "L" level, and the signal SE goes to "H" level. At this time, in the logic circuit G1, the output signal SC' goes to "H" level regardless of the output signal SC from the delay amount detector circuit 15, and the transistor 32 having the gate receiving the signal SC' in the charge pump circuit 12 is turned on. Therefore, in this period, a capacitor 34 is continuously discharged in the charge pump circuit 12 regardless of the level of the output signal SC from the delay amount detector circuit 15, thereby decreasing the voltage of the signal SD at a predetermined inclination.

Figure 8:
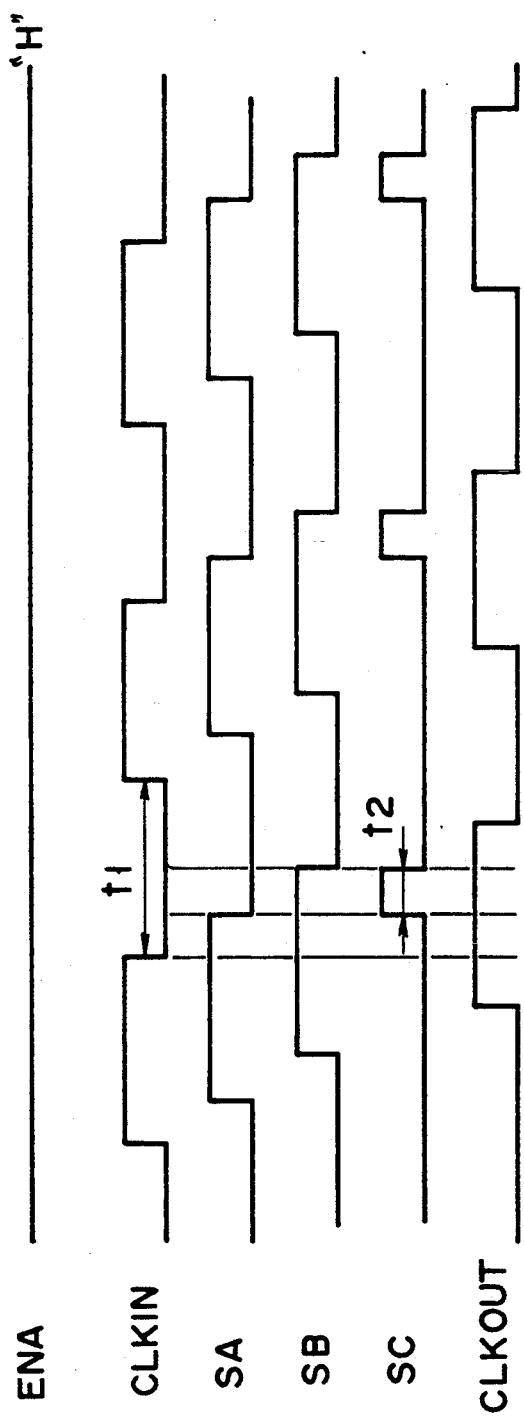
FIG. 8 is a timing chart of the circuit of the first embodiment in FIG. 7.

As shown in FIG. 8, the original discharging operation of the capacitor 34 is controlled on the basis of the signal SC in a period wherein a delay amount t2 per stage is obtained, thereby controlling the voltage of the signal SD. However, in this embodiment, when the voltage of the signal SD is close to the voltage VDD, the capacitor 34 is continuously and forcibly discharged independently of the signal SC. Therefore, the voltage of the signal SD can be rapidly close to a desired value.

When the signal CLKOUTA has three pulses during an "H" period of the signal CLKIN, i.e., when the frequency of the signal CLKOUTA is to be 6 times or more that of the signal CLKIN, the output signal SG from the flip-flop circuit 74 goes to "H" level, and the signal SE goes to "L" level. At this time, since the logic circuit G1 directly outputs the output signal SC from the delay amount detector circuit 15 as the signal SC', the capacitor 34 is charged and discharged with the same operation as that of the circuit of the embodiment shown in FIG. 7, and the operation of the ring oscillator 56 is controlled to stably oscillate a signal having a frequency 10 times that of the input signal CLKIN.

Figure 16:
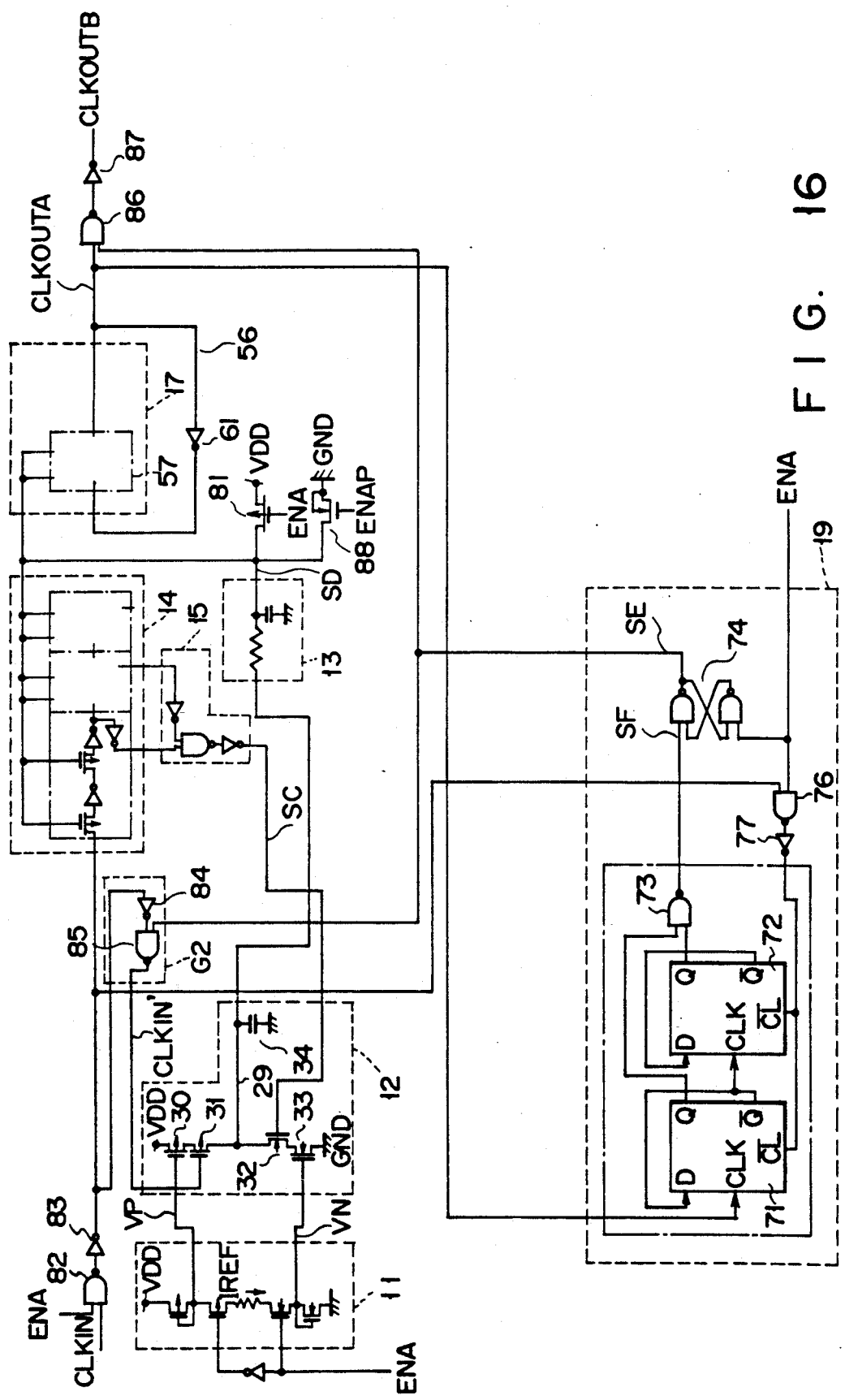
FIG. 16 is a detailed circuit diagram showing another practical arrangement of the circuit of the fourth embodiment of the present invention.

FIG. 16 is a detailed circuit diagram showing an arrangement of a clock signal generator in which the logic circuit G2 is arranged in the circuit of the embodiment shown in FIG. 13.

In the circuit in FIG. 16, the inverter 75 of the oscillation frequency detector circuit 19 in the circuit shown in FIG. 14 is omitted, and an output signal from the flip-flop circuit 74 is output as the signal SE.

The logic circuit G2 comprises an inverter 84 for inverting an output signal from the inverter 83 and a NAND gate 85 for receiving an output signal from the inverter 84 and the output signal SE from the oscillation frequency detector circuit 19. An output from the NAND gate 85 is supplied to a transistor 31 in the charge pump circuit 12 as a signal CLKIN'.

In the circuit shown in FIG. 16, the output signal CLKOUTA from the ring oscillator 56 is not directly output to an external circuit but output in accordance with the level of the output signal SE from the oscillation frequency detector circuit 19. That is, the signal CLKOUTA and the signal SE are supplied to a NAND gate 86, an output signal from the NAND gate 86 is supplied to an inverter 87, and an output signal CLKOUTB from the inverter 87 is output to an external circuit. In addition, in the circuit in FIG. 16, the source-drain path of an n-channel MOS transistor 88 is inserted between a ground voltage GND and a node of the signal SD. As shown in FIG. 17, a one-shot pulse signal ENAP coincident with the signal ENA is supplied to the gate of the transistor 88.

In the circuit in FIG. 16, as shown in the timing chart in FIG. 17, and the signal SF from the NAND gate 73 is continuously set at "H" level in a period from when the signal ENA goes to "H" level to start the operation of the circuit to when the signal CLKOUTA has three pulses during an "H" period of the signal CLKIN. For this reason, the output signal SE from the oscillation frequency detector circuit 19 goes to "L" level. At this time, in the logic circuit G2, the signal CLKIN' goes to the "H" level regardless of the input signal CLKIN, and the transistor 31 having the gate receiving the signal CLKIN' in the charge pump circuit 12 is turned off. Therefore, during this period, the capacitor 34 is not continuously precharged in the charge pump circuit 12 regardless of the level of the input signal CLKIN. The transistor 88 inserted between the node of the signal SD and the ground voltage GND is turned on when the signal ENAP goes to "H" level, thereby reliably dropping the voltage of the node of the signal SD. That is, after the signal ENA goes to "H" level, the output level of an inverter 46 in each of the delay stages 37 and 38 in a variable delay circuit 14 (all of which are shown in FIG. 11) is not determined, and outputs from the circuit 14 are to be uncertain. Even if the node of the signal SC is set at "L" level and the node of the signal SD is not discharged to dynamically hold the "H" level of the signal SD, the voltage of the node of the signal SD is certainly decreased by turning on the transistor 88. For this reason, the input signal CLKIN is transmitted to the variable delay circuit 14, and "H"-level pulses reliably appear at the node of the signal SC. Since the potential of the signal SD prevents the precharging operation caused by the oscillation frequency detector circuit 19, the potential of the signal SD is decreased with a predetermined inclination. When the signal CLKOUTA has three pulses during an "H" period of the signal CLKIN, the output signal SE from the oscillation frequency detector circuit 19 goes to "H" level. At this time, since the logic circuit G2 directly outputs the input signal CLKIN as the signal CLKIN', the capacitor 34 is charged and discharged with the same operation as that of the circuit in FIG. 7, and the operation of the ring oscillator 56 is controlled to stably oscillate a signal having a frequency 10 times that of the input signal CLKIN.

In the circuit in FIG. 16, the frequency of the signal CLKOUTA is 6 times or more that of the signal CLKIN. When the output signal SE from oscillation frequency detector circuit 19 goes to "H" level, the NAND gate 86 is opened, and the signal CLKOUTB having the same frequency as that of the signal CLKOUTA is output to an external circuit.

In the circuit in FIG. 16, when the signal ENA goes to "L" level, for initial setting or as a gate floating countermeasure during an "L" period of the signal ENA, pull-up and pull-down transistors having the signal ENA or $\overline{\text{ENA}}$ as an input may be connected to the input sides of inverters 42 and 45 of each delay stage in the variable delay circuit 14 (all of which are shown in FIG. 11).

In the circuits in FIGS. 14 and 16, since a circuit for detecting the oscillation frequency of the ring oscillator 56 is arranged, as in a case wherein an initial voltage is applied to the signal SD by the initial voltage setting circuit 16 as in the circuit in FIG. 7, a time required for setting the voltage of the signal SD to a predetermined value can be further shortened. Therefore, a time until oscillation is stably performed can be largely shortened.

Figure 18:
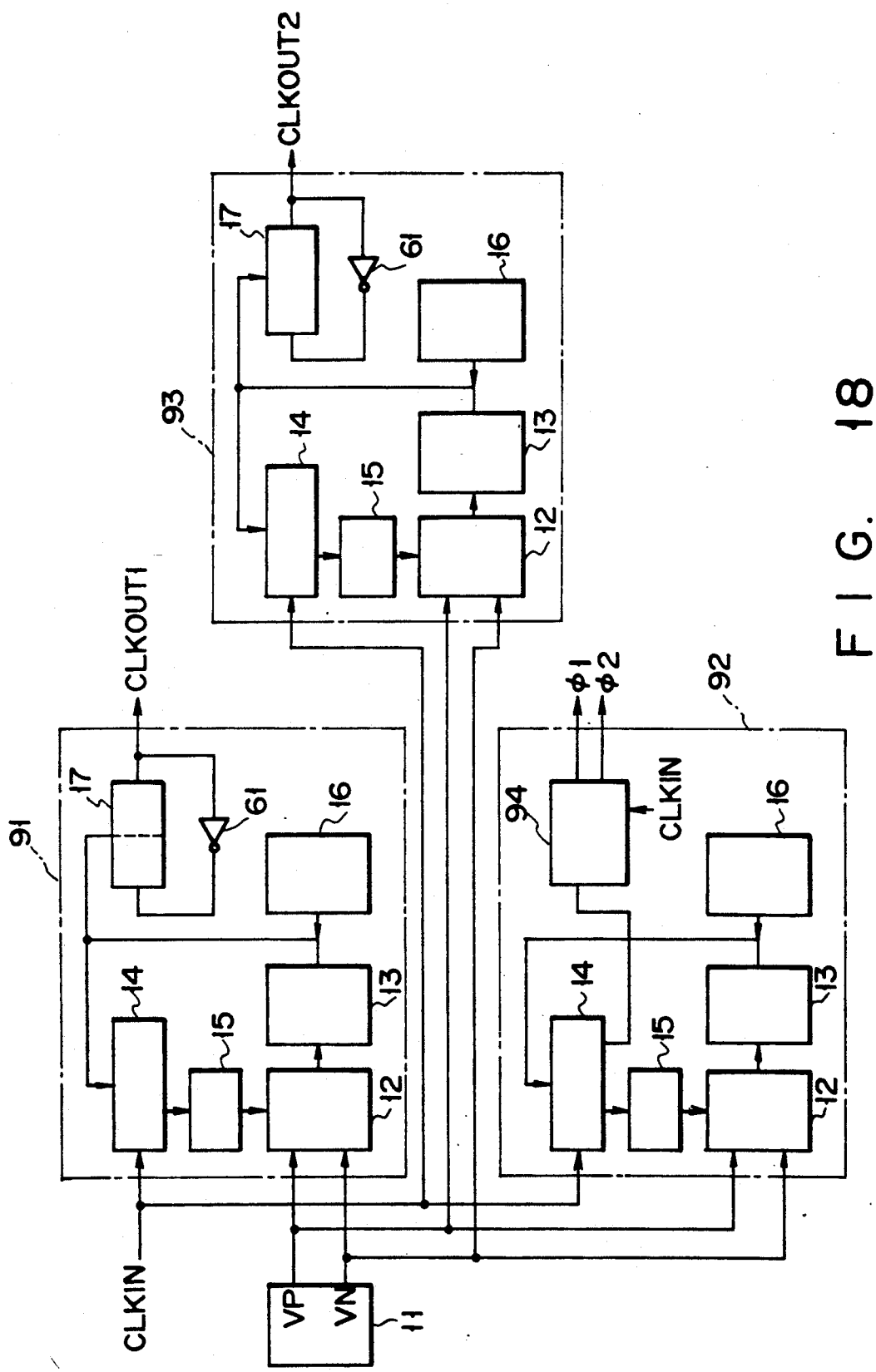
FIG. 18 is a block diagram showing an arrangement of a clock signal generator according to the fifth embodiment of the present invention.

FIG. 18 is a circuit diagram showing a clock signal generator according to the fifth embodiment of the present invention. The circuit of this embodiment is a circuit for generating three difference clock signals and basically constituted by three circuit blocks 91, 92, and 93.

The block 91 is the same as the circuit in FIG. 11 except for the reference current setting circuit 11. That is, the block 91 includes a charge pump circuit 12, a low-pass filter circuit 13, a variable delay circuit 14, a delay amount detector circuit 15, an initial voltage setting circuit 16, a variable delay circuit 17, and an inverter 61 serving as a feedback means. Two delay stages are arranged in the variable delay circuit 17. The block 92 includes a charge pump circuit 12, a low-pass filter circuit 13, a variable delay circuit 14, a delay amount detector circuit 15, an initial voltage setting circuit 16, and a logic circuit 94. The logic circuit 94 in the block 92 generates clock signals $\phi 1$ and $\phi 2$ having two phases on the basis of an output signal and an input signal CLKIN from the variable delay circuit in the block 92. The clock signals $\phi 1$ and $\phi 2$ have the same frequency as that of the input signal CLKIN. Note that the logic circuit 94 will be described later.

The block 93 is the same as the circuit in FIG. 11 except for the reference current setting circuit 11. That is, the block 93 includes a charge pump circuit 12, a low-pass filter circuit 13, a variable delay circuit 14, a delay amount detector circuit 15, an initial voltage setting circuit 16, and a variable delay circuit 17, and an inverter 61 serving as a feedback means. One delay stage is arranged in the variable delay circuit 17. One reference current setting circuit 11 commonly used for three blocks 91, 92, and 93 supplies voltages VP and VN to each of the three blocks 91, 92, and 93.

Figure 19:
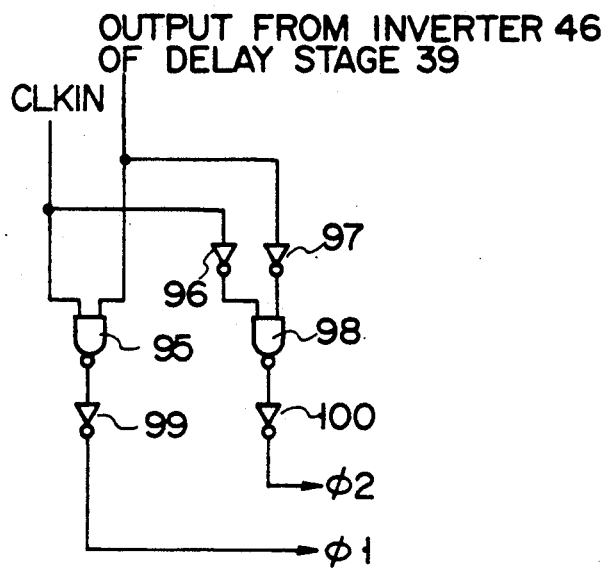
FIG. 19 is a detailed block diagram showing an arrangement of a partial circuit used in the circuit of the fifth embodiment in FIG. 18.

FIG. 19 shows a detailed arrangement of the logic circuit 94 arranged in the block 92. The logic circuit 94 includes a NAND gate 95 for receiving the input signal CLKIN and an output signal from an inverter 46 of a delay stage serving as the last stage of the variable delay circuit 14 in the block 92, two inverters 96 and 97 for respectively inverting the input signal CLKIN and the output signal, a NAND gate 98 for receiving output signals from the inverters 96 and 97, and two inverters 99 and 100 for respectively inverting output signals from the NAND gates 95 and 98.

Figure 20:
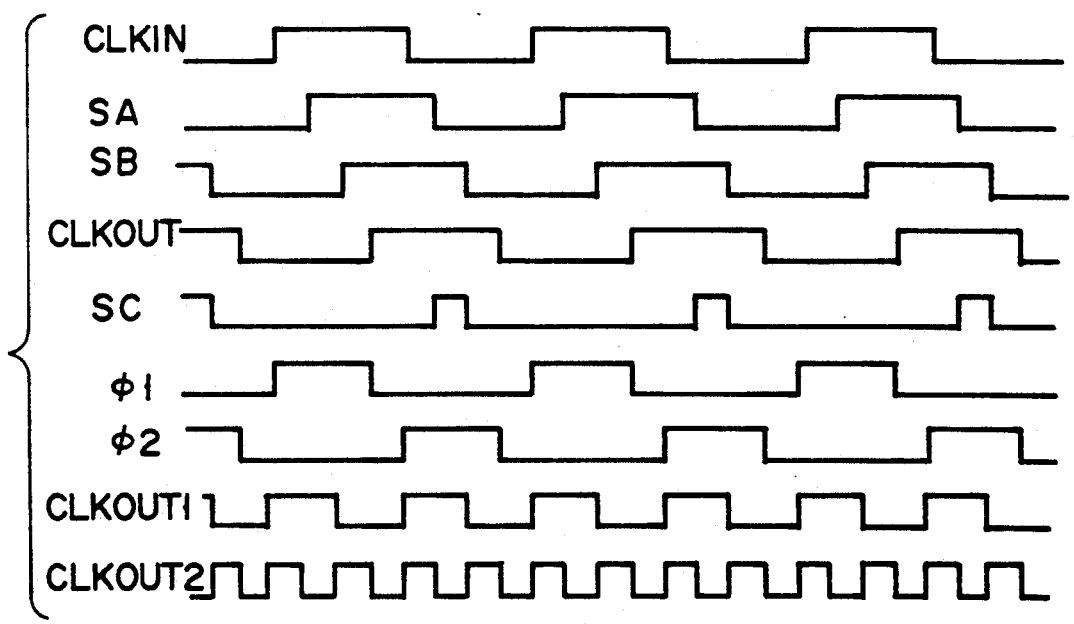
FIG. 20 is a timing chart of the circuit in FIG. 18.

In the circuit of the fifth embodiment shown in FIG. 18, as shown in the timing chart in FIG. 20, the block 91 makes an output signal CLKOUT1 from the input signal CLKIN, the block 92 makes the clock signals $\phi 1$ and $\phi 2$ having two phases from the input signal CLKIN, and the block 93 makes an output signal CLKOUT2 from the input signal CLKIN. The timing chart in FIG. 20 shows a case wherein a ratio (A2/A1) of the value of A2 to the value of A1 in each of the charge pump circuits 12 is set to be 4. However, the ratio can be independently set in units of blocks. The value of the ratio is not limited to an integer but selected from real numbers including decimal parts.

Figure 21:
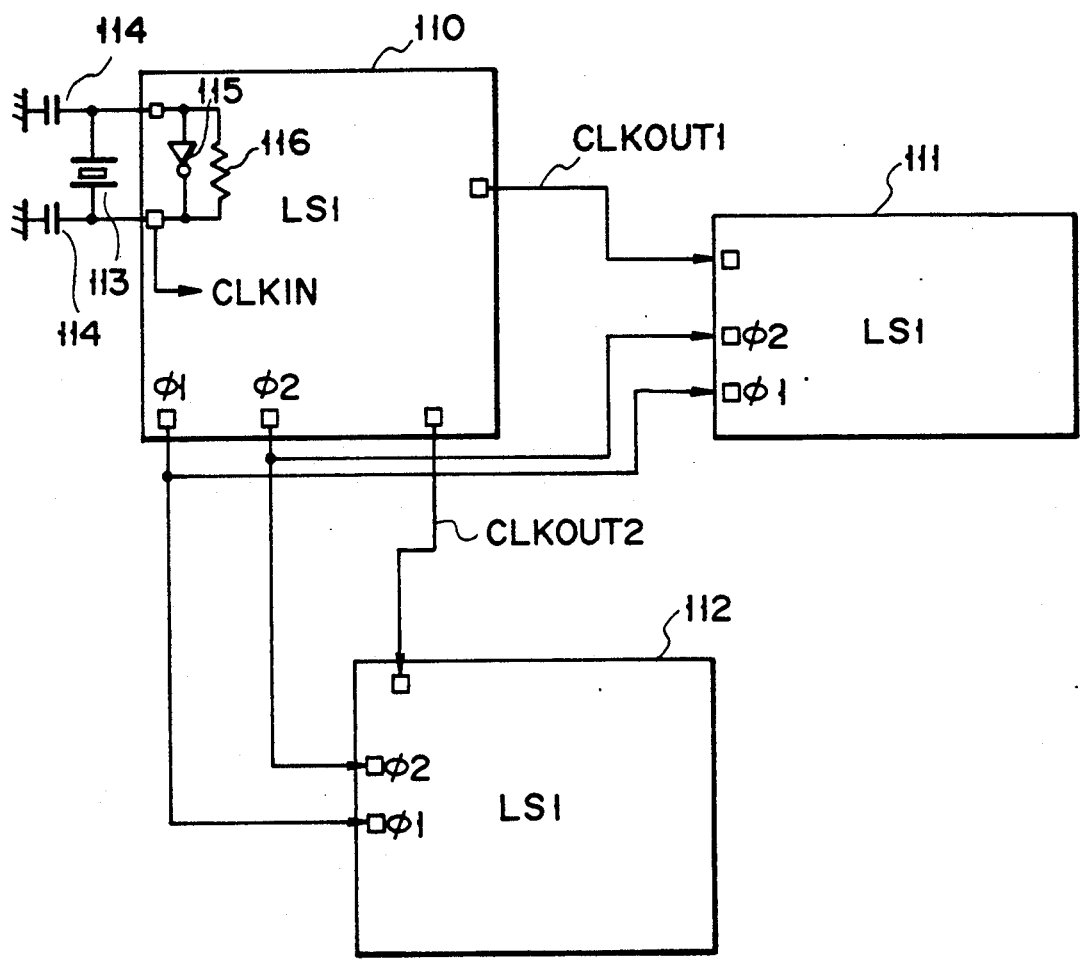
FIG. 21 is a block diagram showing an arrangement of an integrated circuit according to the sixth embodiment of the present invention using the circuit in FIG. 18.

FIG. 21 is a block diagram showing an arrangement of an integrated circuit according to the sixth embodiment of the present invention using the circuit in FIG. 18. In the circuit in FIG. 21, circuits for generating three difference clock signals CLKOUT1, CLKOUT2, and $\phi 1$ and $\phi 2$ as shown in FIG. 18 are arranged in one LSI (Large-Scale Integrated circuit) 110, and the three clock signals CLKOUT1, CLKOUT2, and $\phi 1$ and $\phi 2$ generated by the LSI 110 are distributed to other LSIs 111 and 112.

An oscillating feedback circuit including an inverter 115 and a resistor 116 for generating a signal CLKIN is arranged in the LSI 110, and a crystal oscillator 113, a capacitor 114, and the like are connected to the LSI 110. Therefore, the remaining LSIs require no oscillator or the like, and an effect such as reduction of the power consumptions or sizes of the LSIs 111 and 112 can be obtained.

As described above according to the present invention, there is provided a signal delay circuit capable of always obtaining a predetermined delay amount without influences of variations in manufacturing conditions or the like and in application conditions or the like due to voltage dependency.

An output clock signal can always be obtained without influences of variations in manufacturing conditions or the like and in application conditions or the like due to voltage dependency.

In addition, according to the present invention, when clock signals are used in a plurality of integrated circuits, plural types of clock signals are generated from one integrated circuit, and these clock signals are distributed to other integrated circuits, thereby obtaining a compact system having low power consumption.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A signal delay circuit comprising:
   variable delay means for delaying an input signal by a time according to a control signal to obtain an output signal;
   a logic circuit for detecting a signal delay amount of said variable delay means;
   a charge pump circuit, having a capacitor, for generating a DC voltage by controlling charging and discharging operations of said capacitor by a current an arbitrary number of times a reference current on the basis of the input signal and a detection signal from said logic circuit to apply the DC voltage to said variable delay means as the control signal, said charge pump circuit being set so that a power ratio of a charging current to a discharging current is set to be a reciprocal of a pulse width ratio of the input signal to the detection signal from said logic circuit; and initial value setting means for setting an initial value of the control signal.

2. A signal delay circuit comprising:

variable delay means, constituted by at least one delay stage in which a signal delay time is controlled on the basis of a control signal, for delaying an input signal to obtain an output signal;

a logic circuit for detecting a signal delay amount of said variable delay means;

a charge pump circuit, having a capacitor, for generating a DC voltage by controlling charging and discharging operations of said capacitor by a current an arbitrary number of times a reference current on the basis of the input signal and a detection signal from said logic circuit to apply the DC voltage to said variable delay means as the control signal, said charge pump circuit being set so that a power ratio of a charging current to a discharging current is set to be a reciprocal of a pulse width ratio of the input signal to the detection signal from said logic circuit; and initial value setting means for setting an initial value of the control signal.

3. A circuit according to claim 2, wherein a low-pass filter is inserted between said charge pump circuit and said variable delay means.

4. A circuit according to claim 2, wherein a first delay stage in said variable delay means is constituted by:

an input node;

a first transistor having a source and a drain, one of which is connected to said node, and a gate for receiving the control signal;

a first inverter having an input terminal connected to the other of the source and drain of the first transistor;

a second transistor having a same polarity as that of said first transistor, a source and a drain, one of which is connected to an output terminal of said first inverter, and a gate for receiving the control signal;

a second inverter having an input terminal connected to the other of the source and drain of said second transistor;

an output node connected to an output terminal of said second inverter; and a third inverter having on input terminal connected to said output node and an output terminal connected to said logic circuit.

5. A circuit according to claim 2, wherein said charge pump circuit is constituted by:

an output node of the DC voltage;

first and second transistors each having a first polarity, a source-drain path inserted in series between a first power source voltage and said output node, and a gate for receiving a first predetermined reference voltage and the input signal, respectively;

third and fourth transistors each having a second polarity, a source-drain path inserted in series between said output node and a second power source voltage, and a gate for receiving an output from said logic circuit and a second predetermined reference voltage, respectively; and a capacitor connected to said output node.

6. A circuit according to claim 2, wherein said logic circuit receives at least two output signals from said delay stage in said variable delay means and detects a signal delay amount per stage.

7. A circuit according to claim 2, further comprising a reference voltage circuit for generating the first and second reference voltages used for setting a value of the reference current in said charge pump circuit.

8. A circuit according to claim 7, wherein said reference voltage circuit is constituted by:

first and second nodes from which the first and second reference voltages are obtained;

a first transistor having a first polarity, a source-drain path inserted between a first power source voltage and said first node, and a gate connected to said first node;

a second transistor having a second polarity, a source-drain path inserted between a second power source voltage and said second node, and a gate connected to said second node; and a resistor connected between said first and second nodes.

9. A circuit according to claim 2, wherein said initial value setting means is constituted by:

first and second resistors inserted in series between a first power source voltage and a second power source voltage; and a switch circuit inserted between a series-connection point of said first and second resistors and the control signal supplied to said variable delay means.

10. A clock signal generator comprising:

first variable delay means constituted by a plurality of delay stages connected in series, wherein an input signal is received and delayed so as to control a signal delay time on each delay stage in response to a control signal;

a logic circuit for detecting a signal delay amount of said first variable delay means;

a charge pump circuit, having a capacitor, for generating a DC voltage by controlling charging and discharging operations of said capacitor by a current an arbitrary number of times a reference current on the basis of the input signal and a detection signal from said logic circuit to apply the DC voltage to said first variable delay means as the control signal, said charge pump circuit being set so that a power ratio of a charging current to a discharging current is set to be a reciprocal of a pulse width ratio of the input signal to the detection signal from said logic circuit;

initial value setting means for setting an initial value of the control signal;

second variable delay means constituted by at least one delay stage having the same arrangement as that of said delay stage in said first variable delay means and a signal delay time controlled on the basis of the control signal generated by said charge pump circuit; and feedback means for feeding back an output from a delay stage serving as a last stage to a delay stage serving as a first stage in said second variable delay means.

11. A circuit according to claim 10, wherein a low-pass filter circuit is inserted between said charge pump circuit and said first variable delay means.

12. A generator according to claim 10, wherein said delay stage in said first delay means is constituted by:

an input node;

a first transistor having a source and a drain, one of which is connected to said input node, and a gate for receiving the control signal;

a first inverter having an input terminal connected to the other of the source and drain of said first transistor;

a second transistor having the same polarity as that of said first transistor, a source and a drain, one of which is connected to an output terminal of said first inverter, and a gate for receiving the control signal;

a second inverter having an input terminal connected to the other of the source and drain of said second transistor;

an output node connected to an output terminal of said second inverter; and a third inverter having an input terminal connected to said output node and an output terminal connected to said logic circuit.

13. A generator according to claim 10, wherein said charge pump circuit is constituted by:

an output node of the DC voltage;

first and second transistors each having a first polarity, a source-drain path inserted in series between a first power source voltage and said output node, and a gate for receiving a first predetermined reference voltage and the input signal, respectively;

third and fourth transistors each having a second polarity, a source-drain path inserted in series between said output node and a second power source voltage, and a gate for receiving an output from said logic circuit and a second predetermined reference voltage, respectively; and a capacitor connected to said output node.

14. A circuit according to claim 10, wherein said logic circuit receives at least two output signals from said delay stages in said first variable delay means and detects a signal delay amount per stage.

15. A circuit according to claim 10, further comprising a reference voltage circuit for generating the first and second reference voltages used for setting a value of the reference current in said charge pump circuit.

16. A circuit according to claim 15, wherein said reference voltage circuit is constituted by:

first and second nodes from which the first and second reference voltages are obtained;

a first transistor having a first polarity, a source-drain path inserted between a first power source voltage and said first node, and a gate connected to said first node;

a second transistor having a second polarity, a source-drain path inserted between a second power source voltage and said second node, and a gate connected to said second node; and a resistor connected between said first and second nodes.

17. A circuit according to claim 10, wherein said initial value setting means is constituted by:

first and second resistors inserted in series between a first power source voltage and a second power source voltage; and a switch circuit inserted between a series-connection point of said first and second resistors and the control signal supplied to said first and second variable delay means.

18. A clock signal generator comprising:

first variable delay means constituted by a plurality of delay stages connected in series, wherein an input signal is received and delayed so as to control a signal delay time on each delay stage in response to a control signal;

a logic circuit for detecting a signal delay amount of said first variable delay means;

second variable delay means constituted by at least one delay stage having the same arrangement as that of the delay stage of said first variable delay means and a signal delay time controlled on the basis of the control signal;

a charge pump circuit, having a capacitor, for generating a DC voltage by controlling charging and discharging operations of said capacitor by a predetermined current to apply the DC voltage to said first and second variable delay means as the control signal;

feedback means feeding back an output from said second variable delay means to an input side of said second variable delay means and constituting an oscillator for obtaining a clock signal together with said second variable delay means;

frequency detecting means for detecting an oscillation frequency of said oscillator; and control means for continuously performing or stopping a charging or discharging operation of said capacitor in said charge pump circuit for a predetermined period in accordance with an output from said frequency detecting means.

19. A generator according to claim 18, wherein said frequency detecting means includes a counter circuit for receiving an output from said oscillator as a clock signal and the input signal as a reset signal.

20. A generator according to claim 18, wherein a low-pass filter circuit is inserted between said charge pump circuit and said first and second variable delay means.

21. A generator according to claim 18, wherein said delay stage in said first delay means is constituted by:

an input node;

a first transistor having a source and a drain, one of which is connected to said input node, and a gate for receiving the control signal;

a first inverter having an input terminal connected to the other of the source and drain of said first transistor;

a second transistor having the same polarity as that of said first transistor, a source and a drain, one of which is connected to an output terminal of said first inverter, and a gate for receiving the control signal;

a second inverter having an input terminal connected to the other of the source and drain of said second transistor;

an output node connected to an output terminal of said second inverter; and a third inverter having an input terminal connected to said output node and an output terminal connected to said logic circuit.

22. A generator according to claim 18, wherein said charge pump circuit is constituted by:

an output node of the DC voltage;

first and second transistors each having a first polarity, a source-drain path inserted in series between a first power source voltage and said output node, and a gate for receiving a first predetermined reference voltage and the input signal, respectively;

third and fourth transistors each having a second polarity, a source-drain path inserted in series between said output node and a second power source voltage, and a gate for receiving an output from said logic circuit and a second predetermined reference voltage, respectively; and a capacitor connected to said output node.

23. A circuit according to claim 18, wherein said logic circuit receives at least two output signals from said delay stages in said first variable delay means and detects a signal delay amount per stage.

24. A circuit according to claim 18, further comprising a reference voltage circuit for generating the first and second reference voltages, used for setting a value of the reference current in said charge pump circuit.

25. A circuit according to claim 24, wherein said reference voltage circuit is constituted by:
   first and second nodes from which the first and second reference voltages are obtained;
   a first transistor having a first polarity, a source-drain path inserted between a first power source voltage and said first node, and a gate connected to said first node;
   a second transistor having a second polarity, a source-drain path inserted between a second power source voltage and said second node, and a gate connected to said second node; and
   a resistor connected between said first and second nodes.

26. A circuit according to claim 18, wherein said initial value setting means is constituted by:
   first and second resistors inserted in series between a first power source voltage and a second power source voltage; and
   a switch circuit inserted between a series-connection point of said first and second resistors and the control signal supplied to said variable delay means.

27. An integrated circuit system comprising:
   a first integrated circuit having a clock signal generator comprising,
   first variable delay means constituted by a plurality of delay stages connected in series, wherein an input signal is received and delayed so as to control a signal delay time on each delay stage in response to a control signal,
   a logic circuit for detecting a signal delay amount of said first variable delay means,
   a charge pump circuit, having a capacitor, for generating a DC voltage by controlling charging and discharging operations of said capacitor by a current an arbitrary number of times a reference current on the basis of the input signal and a detection signal from said logic circuit to apply the DC voltage to said first variable delay means as the control signal, said charge pump circuit being set so that a power ratio of a charging current to a discharging current is set to be a reciprocal of a pulse width ratio of the input signal to the detection signal from said logic circuit,
   initial value setting means for setting an initial value of the control signal,
   second variable delay means constituted by at least one delay stage having the same arrangement as that of said delay stage in said first variable delay means and a signal delay time controlled on the basis of the control signal generated by said charge pump circuit, and
   feedback means for feeding back an output from a delay stage serving as a last stage to a delay stage serving as a first stage in said second variable delay means; and
   at least one second integrated circuit for receiving a clock signal generated by said clock signal generator in said first integrated circuit.

28. An integrated circuit system comprising:
   a first integrated circuit having a clock signal generator comprising,
   first variable delay means constituted by a plurality of delay stages connected in series, wherein an input signal is received and delayed so as to control a signal delay time on each delay stage in response to a control signal,
   a logic circuit for detecting a signal delay amount of said first variable delay means,
   second variable delay means constituted by at least one delay stage having the same arrangement as that of the delay stage of said first variable delay means and a signal delay time controlled on the basis of the control signal,
   a charge pump circuit, having a capacitor, for generating a DC voltage by controlling charging and discharging operations of said capacitor by a predetermined current to apply the DC voltage to said first and second variable delay means as the control signal,
   feedback means feeding back an output from said second variable delay means to an input side of said second variable delay means and constituting an oscillator for obtaining a clock signal together with said second variable delay means,
   frequency detecting means for detecting an oscillation frequency of said oscillator, and
   control means for continuously performing or stopping a charging or discharging operation of said capacitor in said charge pump circuit for a predetermined period in accordance with an output from said frequency detecting means; and
   at least one second integrated circuit for receiving a clock signal generated by said clock signal generator in said first integrated circuit.

* * * * *